(12) United States Patent
Nomoto

(10) Patent No.: US 8,866,132 B2
(45) Date of Patent: Oct. 21, 2014

(54) SEMICONDUCTOR DEVICE AND ELECTRONIC UNIT

(71) Applicant: Sony Corporation, Tokyo (JP)

(72) Inventor: Akihiro Nomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/671,588

(22) Filed: Nov. 8, 2012

(65) Prior Publication Data

US 2013/0119383 A1   May 16, 2013

(30) Foreign Application Priority Data

Nov. 15, 2011   (JP) ................. 2011-249844

(51) Int. Cl.
*H01L 51/00* (2006.01)
*H01L 27/32* (2006.01)
*H01L 27/28* (2006.01)

(52) U.S. Cl.
CPC .......... *H01L 27/283* (2013.01); *H01L 27/3258* (2013.01)
USPC   257/40; 257/49; 257/E51.005; 257/E51.006; 257/E51.007; 257/E29.273; 257/E21.409; 438/151

(58) Field of Classification Search
USPC ............... 257/40, 49, E21.409, E29.273, 257/E51.005, E51.006, E51.007; 438/151
See application file for complete search history.

(56) References Cited

U.S. PATENT DOCUMENTS

| 8,415,196 B2 * | 4/2013 | Ohe et al. ................... 438/99 |
| 8,623,695 B2 * | 1/2014 | Nomoto et al. ............... 438/99 |
| 2012/0037891 A1 * | 2/2012 | Cho et al. ................... 257/40 |

FOREIGN PATENT DOCUMENTS

JP   2010-186768 A   8/2010

* cited by examiner

*Primary Examiner* — Victor A Mandala
(74) *Attorney, Agent, or Firm* — Wolf, Greenfield & Sacks, P.C.

(57) ABSTRACT

Thin-film transistors and techniques for forming thin-film transistors (TFT). In some embodiments, there is provided a method of forming a TFT, comprising forming a body region of the TFT comprising an organic semiconducting material, and forming a protective layer comprising an organic insulating material. Forming the protective layer comprises contacting the body region of the TFT with a solution comprising the organic insulating material. The organic insulating material is a material that phase separates with the organic semiconducting material when the solution contacts the organic semiconducting material. In other embodiments, there is provided an apparatus comprising a TFT. The TFT comprises a body region comprising an organic semiconducting material and a protective layer contacting the body region and comprising an organic insulating material that, when a solution comprising the organic insulating material contacts the organic semiconducting material, causes the organic insulating material to phase separate with the organic semiconducting material.

13 Claims, 22 Drawing Sheets

FIG. 13A
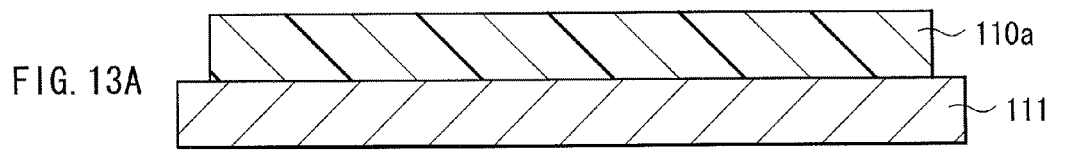
FIG. 13B
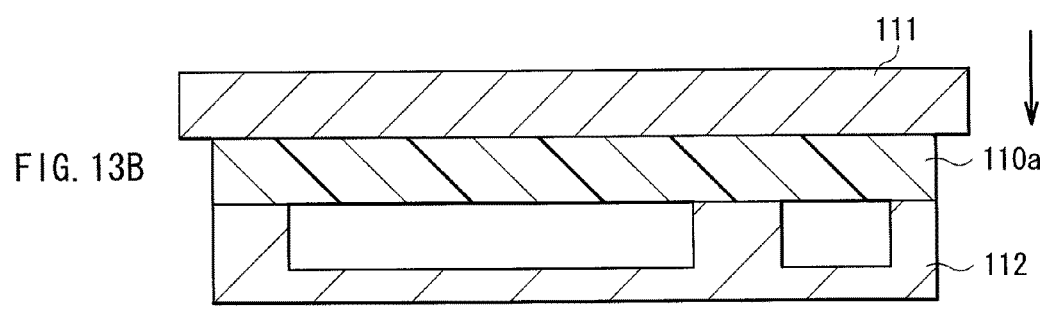
FIG. 13C
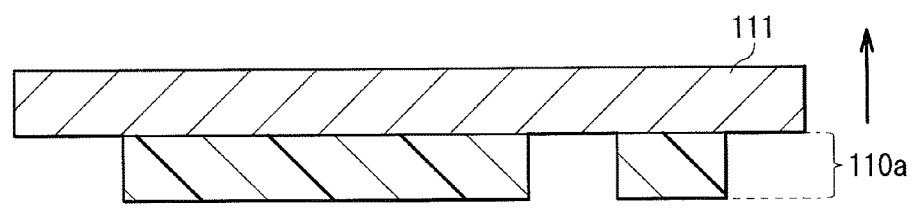
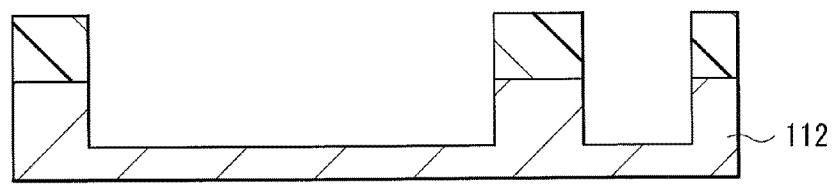

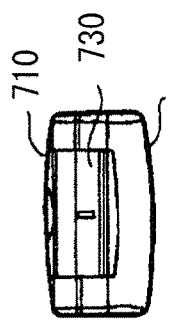
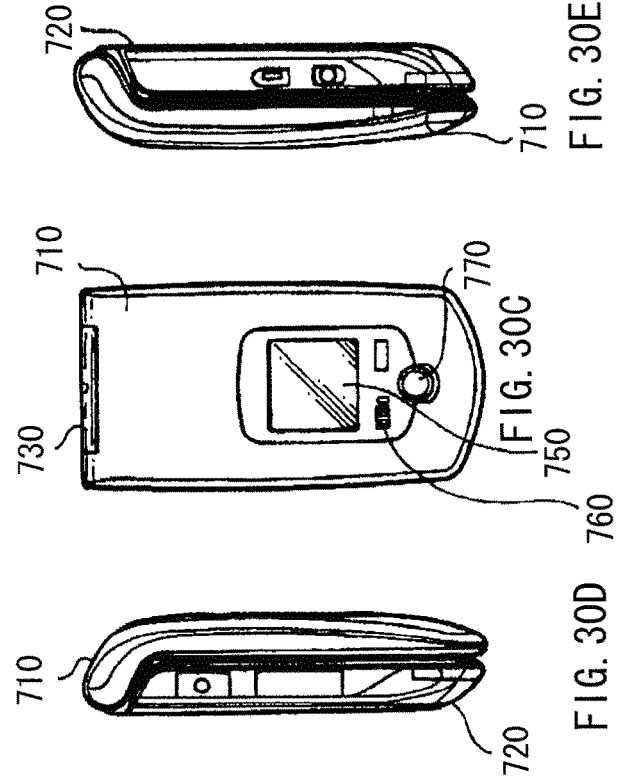
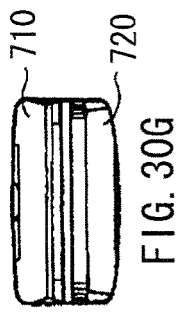
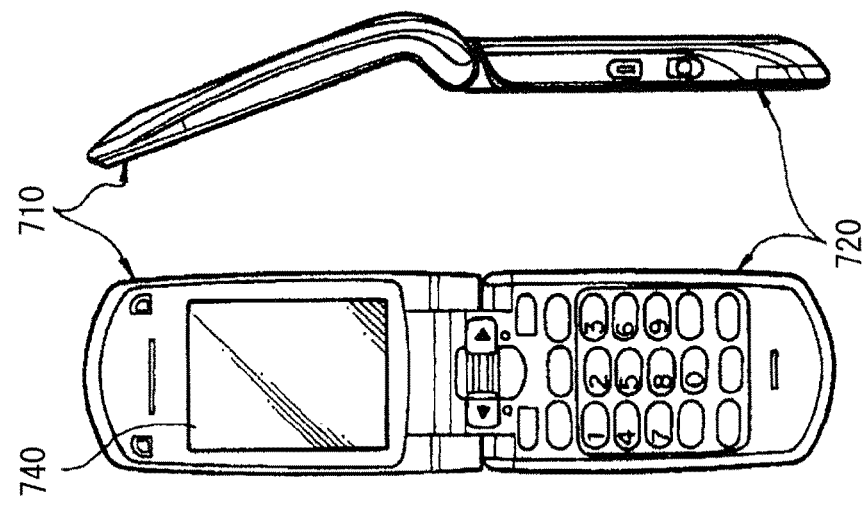

US 8,866,132 B2

SEMICONDUCTOR DEVICE AND ELECTRONIC UNIT

CROSS REFERENCE TO RELATED APPLICATIONS

The present application claims priority under 35 U.S.C. § 119 to Japanese Patent Application No. JP 2011-249844, filed in the Japan Patent Office on Nov. 15, 2011.

BACKGROUND

The disclosure relates to a semiconductor device having, for example, a thin-film transistor (TFT) that uses an organic semiconductor, and also to an electronic unit using the semiconductor device.

There are various types of thin-film transistors (hereinafter referred to as "TFT") in general, such as inorganic TFTs and organic TFTs. The inorganic TFTs use inorganic materials and the organic TFTs use organic materials, in semiconductor layers (active layers). The organic TFTs, in particular, have been attracting attention as drive elements for flexible displays.

In the organic TFT, a semiconductor layer is easily damaged (dissolved) by an organic solvent and hence, a protective film is provided on the semiconductor layer. A technique of using fluororesin as a material of this protective film has been suggested (see, for example, Japanese Unexamined Patent Application Publication No. 2010-186768). When the fluororesin is used in this way, the protective film is formed by, for instance, dissolving the fluororesin in a fluorine-based solvent, and applying this onto the semiconductor layer.

SUMMARY

Fluororesin and fluorine-based solvents are usually expensive, which leads to an increase in material cost. In addition, the fluororesin has water repellency and therefore, a surface treatment is necessary when a film is formed on the fluororesin. This increases the numbers of processes (the number of treatments), which is disadvantageous.

It is desirable to provide a semiconductor device with a protective film capable of being formed at a low-cost and in a simple process, and also to provide an electronic unit including such a semiconductor device.

In one embodiment, there is provided a method of forming a thin-film transistor (TFT) comprising forming a body region of the TFT, the body region comprising an organic semiconducting material, and forming a protective layer comprising an organic insulating material. Forming the protective layer comprises contacting the body region of the TFT with a solution comprising the organic insulating material. The organic insulating material is a material that phase separates with the organic semiconducting material when the solution contacts the organic semiconducting material.

In another embodiment, there is provided an apparatus comprising a thin-film transistor (TFT). The TFT comprises a body region comprising an organic semiconducting material and a protective layer comprising an organic insulating material and contacting the body region. The organic insulating material is a material that, when a solution comprising the organic insulating material contacts the organic semiconducting material, causes the organic insulating material to phase separate with the organic semiconducting material.

In a further embodiment, there is provided an apparatus comprising a display screen, where the display screen comprises a plurality of thin-film transistors (TFTs). Each TFT of the plurality of TFTs comprises a body region comprising an organic semiconducting material and a protective layer comprising an organic insulating material and contacting the body region. The organic insulating material is a material that, when a solution comprising the organic insulating material contacts the organic semiconducting material, causes the organic insulating material to phase separate with the organic semiconducting material.

According to some embodiments of the disclosure, the protective film is provided on the semiconductor layer, and this protective film includes the organic insulating material that is soluble in the organic solvent and causes phase separation with the organic semiconductor. Therefore, in these embodiments, damage to the semiconductor layer caused by the organic solvent during the formation of the protective film may be suppressed, even when an inexpensive organic insulating material is used as a material of the protective film. This may lower the cost of materials, and may eliminate or alleviate the necessity to carry out a surface treatment for wettability control after the formation of the protective film, as compared with a case in which a protective film is formed using fluororesin and a fluorine-based solvent. Accordingly, it may be possible to form the protective film at a low cost and in a simple process.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 13A to 13C are cross-sectional diagrams illustrating a procedure of forming a printing plate according to a modification 1.

FIG. 25 is a schematic diagram illustrating a display driving circuit according to an application example of the backplane in each of the embodiments and the like.

FIG. 26 is a perspective diagram illustrating an appearance of an application example 1 of the embodiments and the like.

FIG. 27A illustrates the appearance when viewed from front, and FIG. 27B illustrates the appearance when viewed from back.

FIGS. 30A to 30G are diagrams of an application example 5, and are a front view in an open state, a side view in the open state, a front view in a closed state, a left-side view, a right-side view, a top view, and a bottom view, respectively.

DETAILED DESCRIPTION

Embodiments of the disclosure will be described below in detail with reference to the drawings. It is to be noted that the description will be provided in the following order.
1. First embodiment (an example of a backplane with a TFT (in a BGTC structure) having a protective film (serving also as an interlayer insulating film) made of a material that causes phase separation with an organic semiconductor)
2. Modification 1 (an example in which the protective film is formed by reverse offset printing)
3. Modification 2 (an example in which the protective film is formed by gravure offset printing)
4. Modification 3 (an example in which an interlayer insulating film is provided on the protective film)
5. Modification 4 (an example of another TFT (in a BGBC structure))
6. Modification 5 (an example of another TFT (in the BGBC structure) in which the interlayer insulating film is provided on the protective film)
7. Modification 6 (an example of the TFT (in the BGBC structure) allowing a semiconductor layer to be patterned using the protective film as a mask).
8. Second embodiment (an example of a backplane with a TFT (in a TGTC structure) having a protective film (also serving as a gate insulator) made of a material that causes phase separation with an organic semiconductor)
9. Modification 7 (an example in which a gate insulator is provided on the protective film)
10. Modification 8 (an example of another TFT (in a TGBC structure))
11. Modification 9 (an example of another TFT (in the TGBC structure) in which the gate insulator is provided on the protective film)
12. Application examples (examples of electronic units each provided with the backplane)

First Embodiment

Configuration

Figure 1:
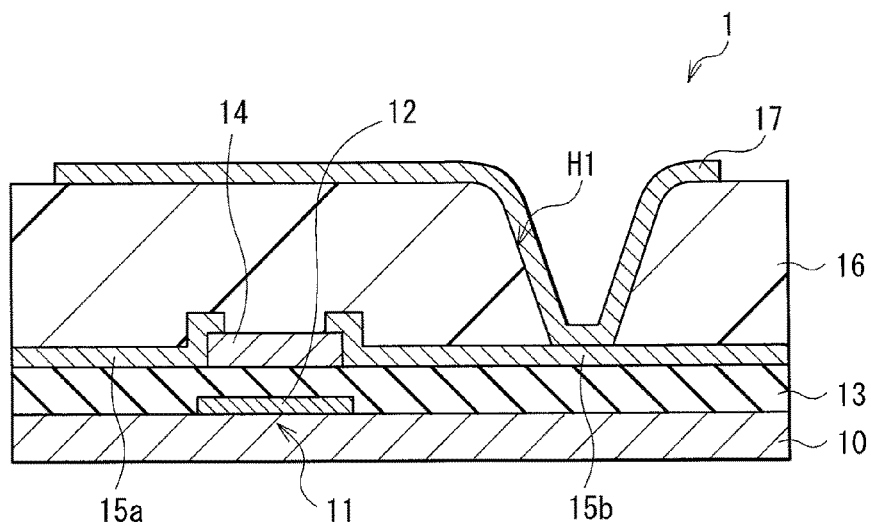
FIG. 1 is a cross-sectional diagram illustrating a schematic configuration of a backplane including a thin-film transistor (in a BGTC structure) according to a first embodiment of the disclosure.

FIG. 1 is a cross-sectional diagram illustrating a schematic configuration of a semiconductor device (including a TFT 11, and a backplane 1) according to a first embodiment of the disclosure. The backplane 1 is, for example, a circuit board provided for display driving, and includes, for instance, one or a plurality of TFTs 11. Here, only one TFT 11 is illustrated.

The TFT 11 may be, for example, an organic TFT having a so-called bottom-gate (BG) structure and a so-called top-contact (TC) structure (i.e., has a BGTC structure). The TFT 11 includes a gate electrode 12 in a selective region on a substrate 10. On this gate electrode 12, a semiconductor layer 14 is provided with a gate insulator 13 interposed therebetween. On the gate insulator 13, the semiconductor layer 14 is patterned in a selective region facing the gate electrode 12. On this semiconductor layer 14, a pair of source-drain electrodes 15a and 15b are disposed to be electrically connected to a part of the semiconductor layer 14.

The substrate 10 may be, for example, a flexible plastic sheet made of polyimide (PI), polyethylene terephthalate (PET), polyether sulfone (PES), polyethylene naphthalate (PEN), polycarbonate (PC), a liquid crystal polymer, and/or the like. Alternatively, a flexible metal sheet, which is made of stainless steel (SUS), aluminum (Al), copper (Cu), and/or the like with a surface having undergone an insulation treatment, may be used as the substrate 10. Besides these materials capable of exhibiting flexibility, the substrate 10 may be a substrate made of a material having rigidity, such as a glass substrate.

The gate electrode 12 controls a carrier density in the semiconductor layer 14 by using a gate voltage (Vg) applied to the TFT 11, and also has a function of serving as wiring that supplies an electric potential. The gate electrode 12 may be configured using a single layer film made of, for example, one of aluminum (Al), titanium (Ti), platinum (Pt), gold (Au), palladium (Pd), chromium (Cr), nickel (Ni), molybdenum (Mo), niobium (Nb), neodymium (Nd), rubidium (Rb), rhodium (Rh), silver (Ag), tantalum (Ta), tungsten (W), copper, indium (In), and tin (Sn). Alternatively, the gate electrode 12 may be configured using a laminated film made of two or more of these materials.

The gate insulator 13 may be a single layer film made of, for example, one of polyvinyl phenol (PVP), diallyphthalate, polyimide, polymethyl methacrylate, polyvinyl alcohol (PVA), polyester, polyethylene, polycarbonate, polyamide, polyamide-imide, polyetherimide, polysiloxane, polymethacrylamide, polyurethane, polybutadiene, polystyrene, polyvinyl chloride, nitrile rubber, acrylic rubber, butyl rubber, epoxy resin, phenolic resin, melamine resin, urea resin, novolac resin, fluorine-based resin, and the like. Alternatively, the gate insulator 13 may be a laminated film made of two or more of these materials. The gate insulator 13 is patterned by etching, after being formed by coating. The gate insulator 13 may be formed by patterning through a printing technique such as ink jet printing, screen printing, offset printing, and gravure printing, depending on the material. Besides the above-described organic insulating films, an inorganic insulating film made of silicon oxide ($SiO_2$), silicon nitride ($SiN_x$), aluminum oxide ($Al_2O_3$), tantalum oxide ($Ta_2O_5$), or the like may also be used as the gate insulator 13.

The semiconductor layer 14 forms a channel by application of the gate voltage. The semiconductor layer 14 may be made of, for example, an organic semiconductor such as triisopropylsilylethynyl (TIPS) pentacene and ethyl-xanthenoxanthene (ethyl-PXX) derivatives. Besides these, a derivative of any one of, or a mixture of two or more of, naphthacene, hexacene, heptacene, pyrene, chrysene, perylene, coronene, rubrene, polythiophene, polyacene, polyphenylene vinylene, polypyrrole, porphyrin, carbon nanotube, fullerene, graphene, metallophthalocyanine, and the like may be used as the organic semiconductor, for example.

The pair of source-drain electrodes 15a and 15b each function as a source electrode or a drain electrode, and are configured using a conductive film material equivalent to those listed above for the gate electrode 12. These source-drain electrodes 15a and 15b are disposed on the semiconductor layer 14, to be electrically connected to the semiconductor layer 14, and to be electrically separated from each other.

In the TFT 11 having the configuration described above, a protective film 16 is provided on the semiconductor layer 14. In the present embodiment, the protective film 16 is formed to cover the semiconductor layer 14 as well as the source-drain electrodes 15a and 15b. The protective film 16 also serves as an interlayer insulating film. The protective film 16 has a through-via (a through-hole) H1 facing the source-drain electrode 15b. A display electrode 17 provided on the protective film 16 is electrically connected to the source-drain electrode 15b through this through-via H1.

The protective film 16 is soluble in a predetermined organic solvent. In addition thereto, the protective film 16 is made of a coating-type organic insulating material that causes phase separation with the organic semiconductor configuring the semiconductor layer 14 (i.e. an organic insulating material that causes phase separation with the organic semiconductor, in a state of being dissolved in an organic solvent). As an example, when an ethyl-PXX derivative is used as the material of the semiconductor layer 14, a polymer material such as poly-α-methyl styrene (PaMS) is suitable for the material of the protective film 16. Alternatively, when TIPS pentacene is used as the material of the semiconductor layer 14, use of a polymer material such as PaMS, polystyrene, and cyclic olefin copolymer is appropriate. It is desirable that the organic solvent dissolving any of these organic insulating materials be also a material that causes phase separation with the organic semiconductor configuring the semiconductor layer 14. Examples of this material include toluene and tetralin. As will be described later in detail, the protective film 16 is formed by dissolving the above-described organic insulating material in the organic solvent, and applying (or printing) a solution maintained at a predetermined viscosity (in a dry state) onto the semiconductor layer 14. It is to be noted that, after the protective film 16 is formed, the organic solvent is removed by drying. Further, the protective film 16 may contain fine particles, a surfactant, and/or the like used to improve printability, in addition to the above-described organic insulating material.

Examples of the organic insulating material used in the protective film 16 include, in addition to the materials described above, polystyrene, polycarbonate, polydimethylsiloxane, nylon, polyimide, cyclic olefin copolymers, epoxy polymers, cellulose, polyoxymethylene, polyolefin polymers, polyvinyl polymers, polyester polymers, polyether polymers, polyamide polymers, biodegradable plastic, amino resin, unsaturated polyester resin, diallyl phthalate resin, epoxy resin, polyimide resin, polyurethane resin, silicone resin, and copolymers formed by combining various polymer units. A material that causes phase separation with the organic semiconductor used in the semiconductor layer 14 (i.e. a material of a predetermined molecular weight) may be selected appropriately from these materials. Meanwhile, it is desirable that the material of the protective film 16 not be a water-based material (a material having an OH group). This is to reduce damage to the semiconductor layer 14.

The protective film 16 may have a thickness of about 0.3 μm to about 10 μm, for example. In the present embodiment, due to this protective film 16, a sufficient protective function of the semiconductor layer 14 is exhibited, and it is not necessary to form an interlayer insulating film separately. Therefore, deterioration in properties of the TFT 11 is suppressed, and also a production process is simplified.

When the backplane 1 is used for display driving, the display electrode 17 may be, for example, a pixel electrode provided for every pixel.

[Production Method]

FIG. 2A to FIG. 8B are diagrams used to describe a method of producing the backplane 1. The backplane 1 may be produced as follows, for example.

Figure 2A:
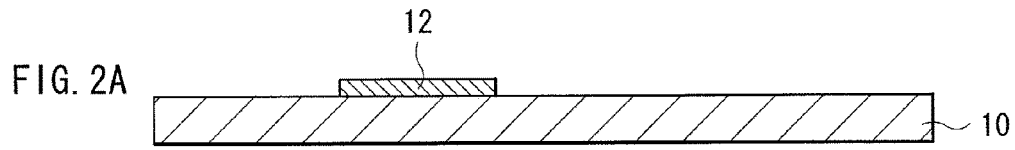
FIGS. 2A and 2B are cross-sectional diagrams illustrating a method of producing the backplane depicted in FIG. 1, in a process order.

First, as illustrated in FIG. 2A, the gate electrode 12 is formed in the selective region on the substrate 10. Specifically, at first, the conductive film material described above, e.g. copper, is deposited over the entire surface on the substrate 10 by sputtering, for example. The conductive film material is then patterned into a predetermined shape, by etching using a photolithographic method, for example.

Figure 2B:
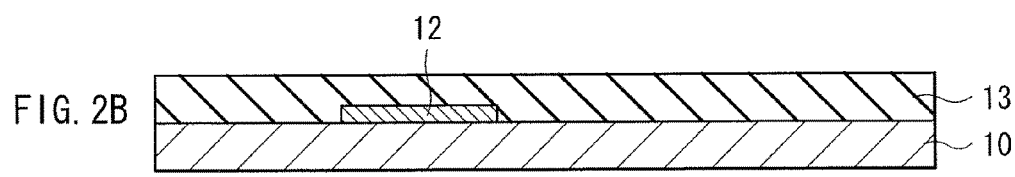

Next, as illustrated in FIG. 2B, the gate insulator 13 is formed on the substrate 10. Specifically, the gate insulator material described above, e.g. a mixture of a PVP solution and a curing agent (melamine resin) is applied over the entire surface on the substrate 10 by, for example, spin coating. This mixture is then subjected to firing.

Figure 3A:
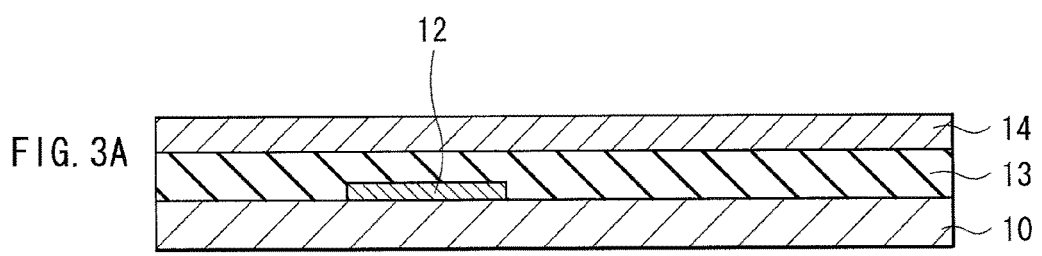
FIGS. 3A and 3B are cross-sectional diagrams illustrating a process following FIG. 2B.
Figure 3B:
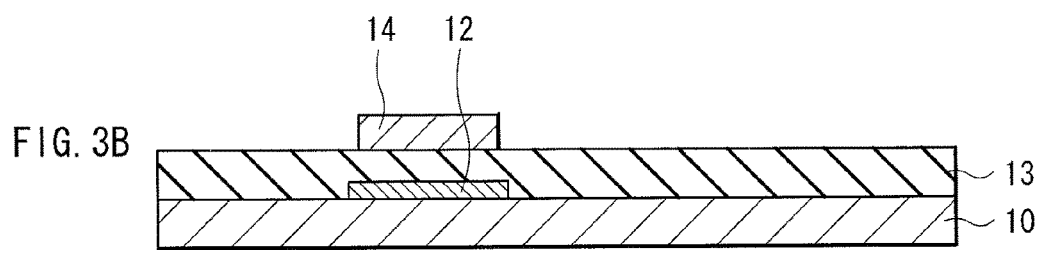

Subsequently, the semiconductor layer 14 is formed to have a pattern on the gate insulator 13. Specifically, first, as illustrated in FIG. 3A, a film of the organic semiconductor described above, e.g. a TIPS pentacene compound solution, is formed over the entire surface of the substrate 10 by, for example, coating such as spin coating, dip coating, and cap coating. The formed film is then dried. Next, as illustrated in FIG. 3B, the formed semiconductor layer 14 is patterned by etching. The semiconductor layer 14 may be formed using a printing method such as screen printing, gravure printing, and ink jet printing, other than the coating described above. Alternatively, the semiconductor layer 14 may be formed to have a pattern by vacuum deposition using a so-called shadow mask. Further, the semiconductor layer 14 may be applied and formed only in a selective region. In this case, a predetermined region (a region where no semiconductor layer is to be formed) of a surface of the gate insulator 13 is subjected to a water-repellent treatment beforehand, and a semiconductor solution is then applied onto the surface of the gate insulator 13. Thus, a part where the semiconductor layer 14 is unnecessary rejects the semiconductor solution.

Figure 4:
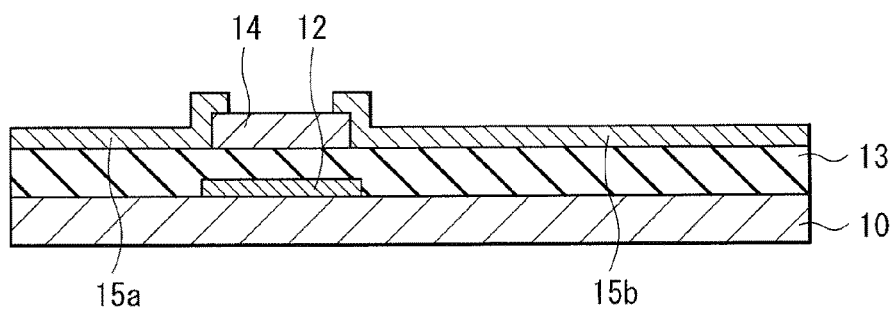
FIG. 4 is a cross-sectional diagram illustrating a process following FIG. 3B.

Next, as illustrated in FIG. 4, the source-drain electrodes 15a and 15b are formed. Specifically, first, the conductive film material described above is deposited over the entire surface on the substrate 10 by sputtering, for example. The deposited conductive film material is then patterned into a predetermined shape by, for example, etching using a photolithographic method. Alternatively, the source-drain electrodes 15a and 15b may be patterned by vacuum deposition using a shadow mask. Still alternatively, the source-drain electrodes 15a and 15b may be formed by having step disconnection in a part of a pattern, after the pattern is formed using a thin-film transfer method such as gravure offset printing and reverse offset printing.

(Formation of Protective Film 16)

Figure 5:
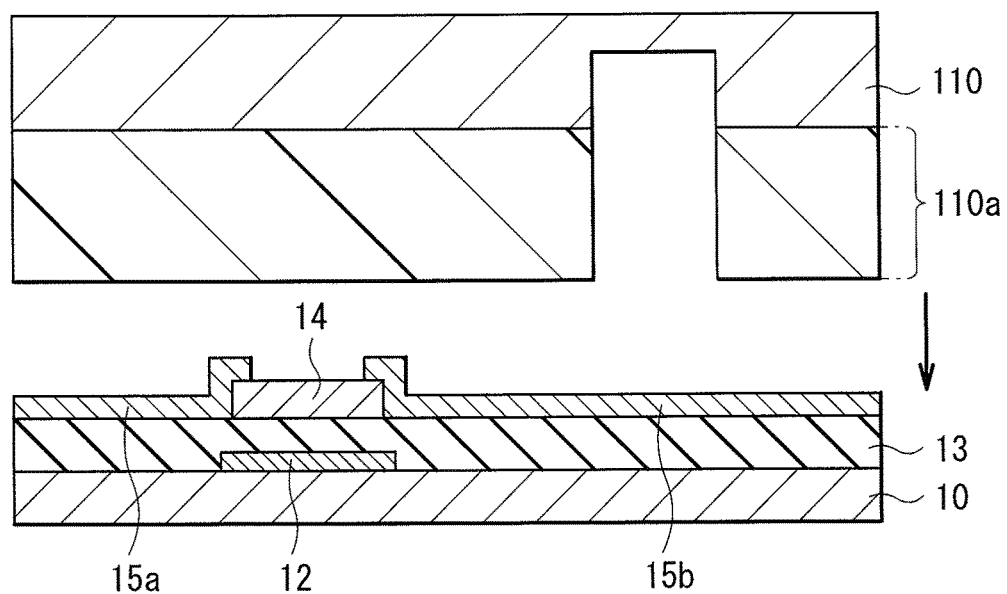
FIG. 5 is a cross-sectional diagram illustrating a process following FIG. 4.
Figure 6A:
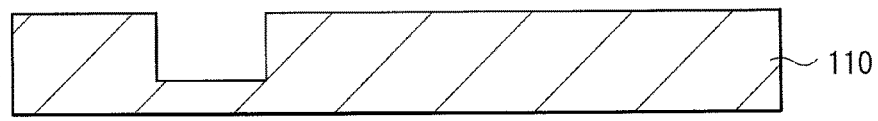
FIGS. 6A and 6B are cross-sectional diagrams illustrating a procedure of forming a printing plate depicted in FIG. 5.
Figure 6B:
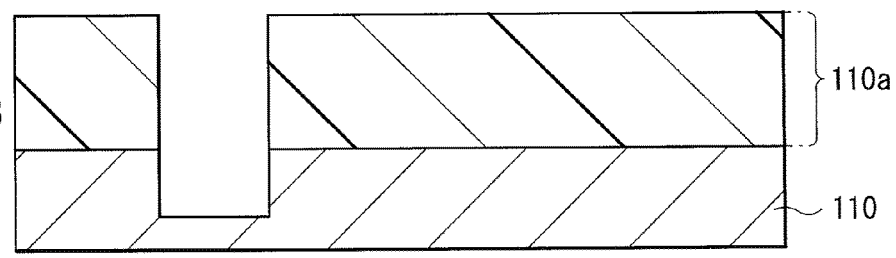

Next, the protective film 16 is formed by a printing method, for example. Specifically, the protective film 16 is formed to have a pattern by transfer (letterpress printing) using a printing plate having a protective-film ink layer 110a on a relief plate 110, as illustrated in FIG. 5, for example. Here, this printing plate is prepared, for example, as follows. The relief plate 110 having projections corresponding to a predetermined pattern (a pattern to be formed of the protective film 16) is prepared as illustrated in FIG. 6A. The protective-film ink layer 110a is charged (applied) onto this relief plate 110 as illustrated in FIG. 6B. It is to be noted that, in the present embodiment, the protective film 16 serves as the interlayer insulating film and has the through-via H1 for interlayer wiring connection. Therefore, in the pattern of the protective-film ink layer 110a, a region facing, for example, the source-drain electrode 15b is selectively removed.

The protective-film ink layer 110a is formed by dissolving the organic insulating material described above in an organic solvent. Therefore, it is desirable to provide the protective-film ink layer 110a with appropriate viscosity, by drying the protective-film ink layer 110a for a predetermined time in a natural drying process or a drying process, after the protective-film ink layer 110a is charged onto the relief plate 110. As the viscosity at this moment, it may be set at an appropriate value according to the molecular weight and the printing method of an organic insulating material used in the protective-film ink layer 110a, as well as the film thickness and the like of the protective-film ink layer 110a.

Figure 7:
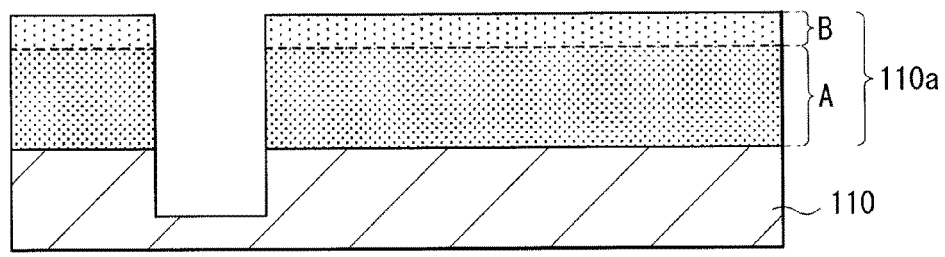
FIG. 7 is a schematic diagram used to describe a layer structure of a protective film pattern formed in the printing plate illustrated in FIG. 5 as well as FIGS. 6A and 6B.

In the printing plate illustrated in FIG. 6B, however, it is desirable that the protective-film ink layer 110a be held in the following layer state. That is, of the protective-film ink layer 110a, a region on a lower side (a side where the relief plate 110 is provided) is a molecule high-content layer A, and a region on a surface side (a side opposite to the side where the relief plate 110 is provided) is a molecule low-content layer B, as schematically illustrated in FIG. 7. In other words, it is desirable that in the protective-film ink layer 110a, the organic insulating material be kept in a state of being more accumulated (sinking) on the relief plate 110 side than on the surface side. It is also desirable that the viscosity of the protective-film ink layer 110a be set at a level in which such a state is maintainable.

Figure 8A:
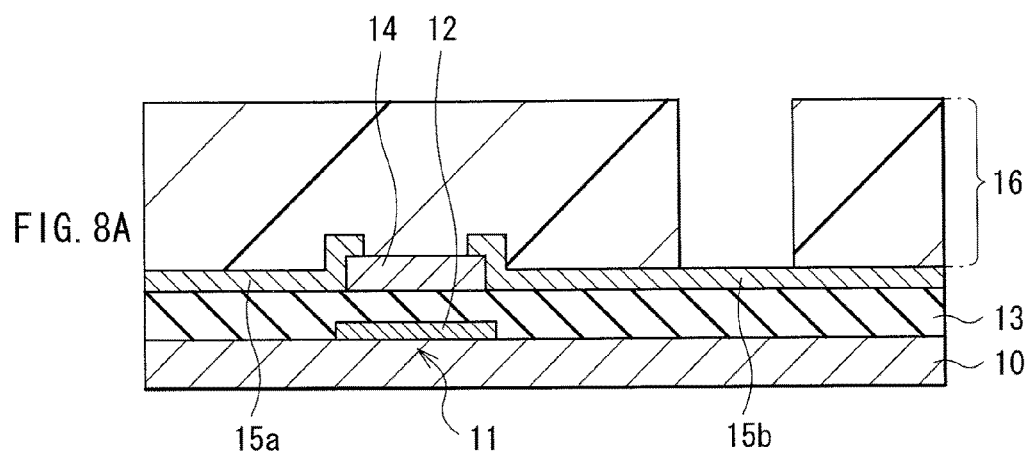
FIGS. 8A and 8B are cross-sectional diagrams illustrating a process following FIG. 5.
Figure 8B:
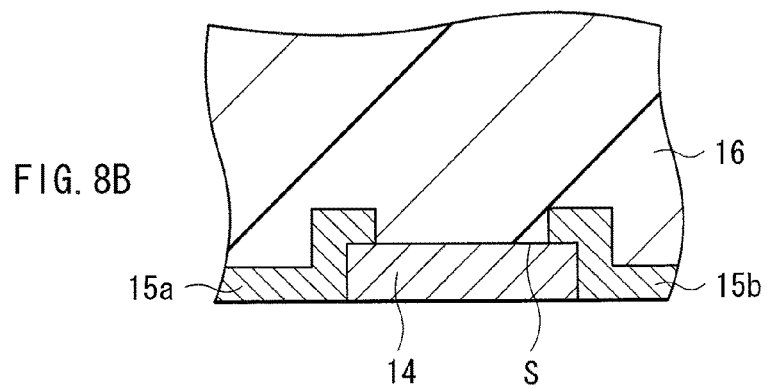

The protective-film ink layer 110a thus formed with the predetermined viscosity on the relief plate 110 is transferred onto the semiconductor layer 14 as well as the source-drain electrodes 15a and 15b (FIG. 5). This makes it possible to realize a layered structure in which the protective film 16 made of the organic insulating material is formed, on the semiconductor layer 14, as illustrated in FIGS. 8A and 8B. Specifically, the protective film 16 is formed on the following principle.

In the present embodiment, the protective-film ink layer 110a is made of a solution in which the organic insulating material is dissolved in the organic solvent as described above, and this solution is maintained to be in the predetermined layer state and to have the predetermined viscosity. When this protective-film ink layer 110a is in contact with the surface of the semiconductor layer 14, the following occurs. First, in the neighborhood of an interface (a contact surface) S between the protective-film ink layer 110a and the semiconductor layer 14, a part on the surface side of the semiconductor layer 14 starts dissolving due to the organic solvent in the protective-film ink layer 110a. The organic semiconductor dissolving in the organic solvent causes phase separation with the organic insulating material (and the organic solvent) contained in the protective-film ink layer 110a. Since the organic semiconductor once dissolving in the organic solvent thus causes phase separation with the protective-film ink layer 110a in the neighborhood of the interface S between the semiconductor layer 14 and the protective-film ink layer 110a, progress of erosion of the semiconductor layer 14 due to the organic solvent is suppressed. In other words, the erosion of the semiconductor layer 14 due to the organic solvent is limited only to the vicinity of the surface, and is unlikely to reach other regions.

Figure 9A:
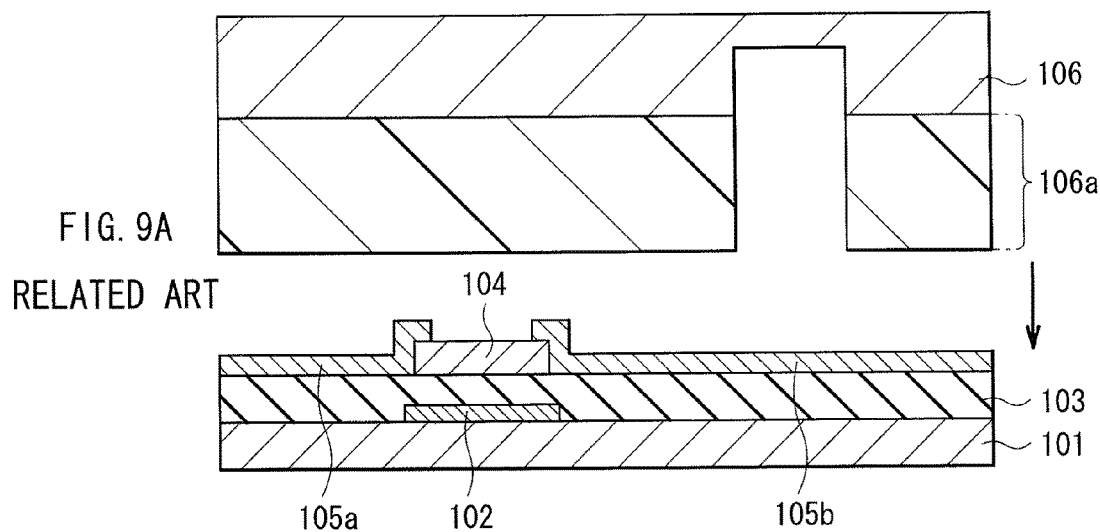
FIGS. 9A and 9B are cross-sectional diagrams used to describe a method of producing a backplane according to a comparative example.
Figure 9B:
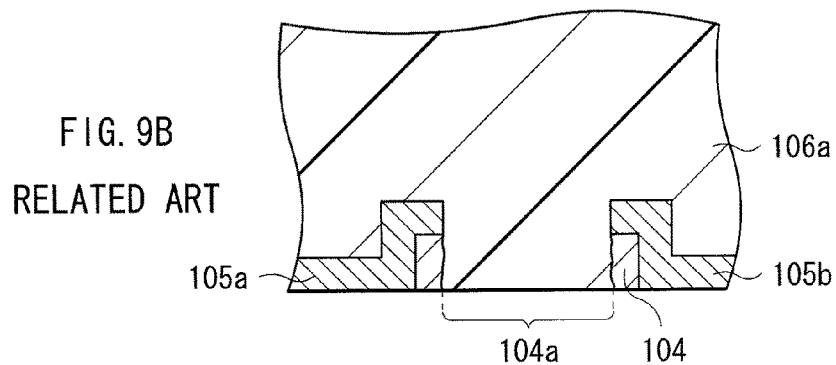

Here, an example in which a material that does not cause phase separation with an organic semiconductor is used as a protective film material is illustrated in FIGS. 9A and 9B, as a comparative example of the present embodiment. In the comparative example, as illustrated in FIG. 9A, a protective film is formed by letterpress printing, after a gate electrode 102, a gate insulator 103, a semiconductor layer 104, and source-drain electrodes 105a and 105b are formed on a substrate 101, in a manner similar to that of the present embodiment. In the comparative example however, unlike the present embodiment, a protective-film ink layer 106a on a relief plate 106 is made of a solution containing an organic solvent and an organic insulating material that does not cause phase separation with an organic semiconductor. When this protective-film ink layer 106a is in contact with a surface of the semiconductor layer 104, the organic solvent in the protective-film ink layer 106a erodes the semiconductor layer 104. As a result, a region 104a that is a part or the whole of the semiconductor layer 104 is removed as illustrated in FIG. 9B, which makes the semiconductor layer 104 not to function as a transistor.

Figure 10:
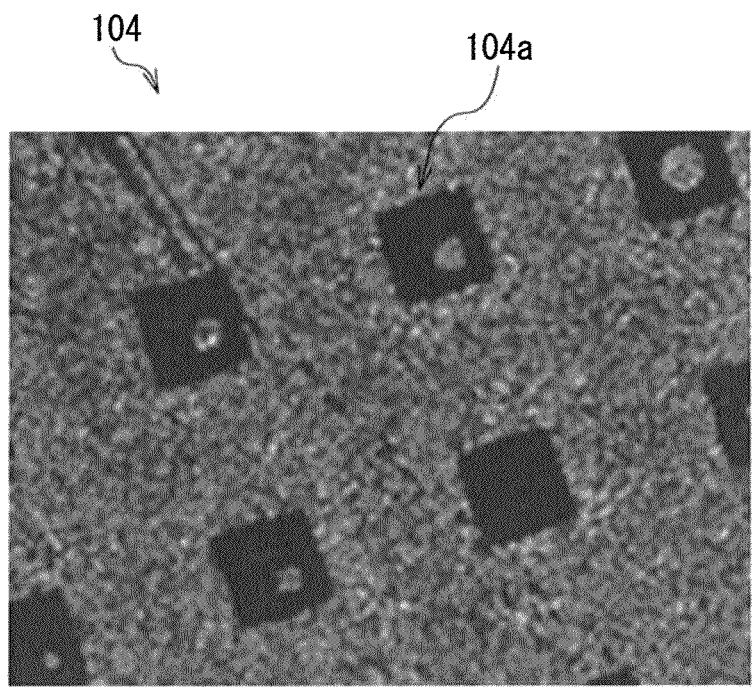
FIG. 10 is a photograph illustrating a film state of a semiconductor layer after formation of a protective film according to the comparative example.
Figure 11:
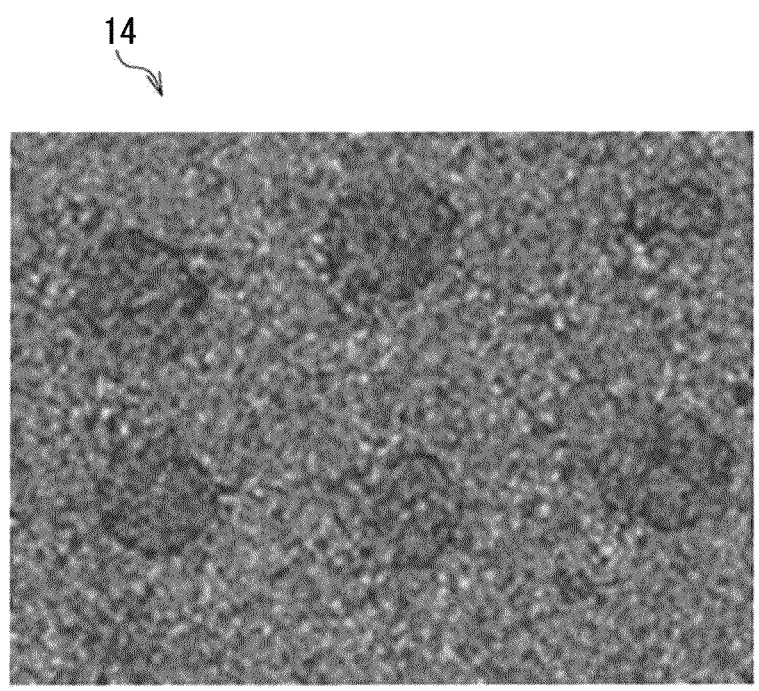
FIG. 11 is a photograph illustrating a film state of a semiconductor layer after formation of the protective film according to an Example of the first embodiment.

FIG. 10 illustrates an observed image of the semiconductor layer 106 after the protective film is formed in this comparative example. In this example, the semiconductor layer 104 is eroded, and the region 104a with no film formation (i.e. a rectangular (dark black part) region) is formed. It is to be noted that a light black region (a gray region) is a region where the semiconductor layer 104 remains. In contrast, in Example of the present embodiment, it can be seen that the semiconductor layer 14 is formed almost uniformly, as illustrated in FIG. 11. In an example of the embodiment and the comparative example, an ethyl-PXX derivative was used as the organic semiconductor of the semiconductor layers 14 and 104, respectively, and gravure printing was adopted as a method of printing the protective film. In addition, in Example of the embodiment, PaMS (with a molecular weight of 100,000) which causes phase separation with the ethyl-PXX derivative was used as the organic insulating material, and toluene was used as the organic solvent. In the comparative example, polystyrene (with a molecular weight of 4,000) was used as the organic insulating material, and toluene was used as the organic solvent. It is to be noted that the polystyrene used in the comparative example has a small molecular weight, and thus does not cause phase separation with the organic semiconductor.

Thus in the present embodiment, erosion of the semiconductor layer 14 is less likely to progress, even when the organic solvent is used in forming the protective film 16. It is to be noted that, as the method of printing the protective film 16, there may be used, gravure printing, flexographic printing, gravure offset printing, planographic offset printing, waterless offset printing, reverse offset printing, screen printing, and/or the like, in addition to the letterpress printing mentioned above. Of these, the gravure offset printing and the reverse offset printing will be described later.

Figure 12:
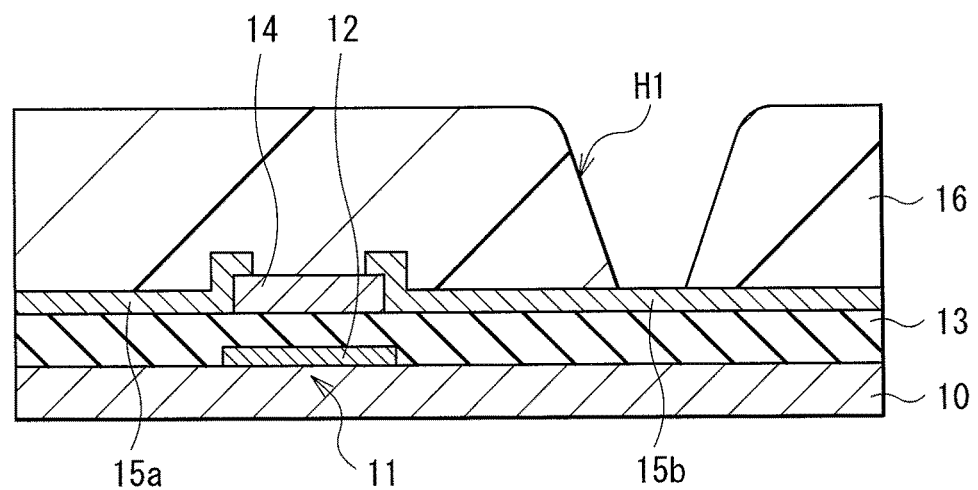
FIG. 12 is a cross-sectional diagram illustrating a process following FIG. 8B.

After the protective film 16 is formed, the through-via H1 is formed by performing reflow of the protective film 16 thereby forming a taper, as illustrated in FIG. 12. However, this reflow may only be performed as necessary (the pattern of the protective film after the transfer as illustrated in FIG. 8A may be used as it is). It is to be noted that, besides the way described above, etching using a photolithographic method, a laser, or the like may be used as a technique of forming the through-via H1. When one of these techniques is used, the through-via H1 may be formed, after the protective film 16 is formed by coating.

Lastly, the display electrode 17 is formed on the protective film 16 by, for example, sputtering, to also cover inside of the through-via H1. The display electrode 17 is then patterned by, for instance, etching using a photolithographic method. This completes the backplane 1 illustrated in FIG. 1.

[Functions and Effects]

In the backplane 1 of the present embodiment, when, for example, a predetermined electric potential is supplied to the gate electrode 12 in the TFT 11, an electric field is produced (a channel is formed) in the semiconductor layer 14. Then, a current flows between the source-drain electrodes 15a and 15b, and thereby, for example, a drive voltage for display is supplied to the display electrode 17.

Here, in the TFT 11 of the backplane 1 of the present embodiment, the organic semiconductor is used in the semiconductor layer 14 and thus, the semiconductor layer 14 is readily damaged by the organic solvent. For this type of TFT, usually, a semiconductor protective film is formed using fluororesin. In this case, the fluororesin is used by being dissolved in a fluorine-based solvent. However, these fluorine-based materials are expensive. Moreover, because the fluororesin has water repellency, it is necessary to perform a surface treatment for wettability control after the protective film is formed. In the present embodiment, the organic solvent is used when the protective film 16 is formed. However, since the organic insulating material that causes phase separation with the semiconductor layer 14 is used in the protective film 16, progress of the erosion of the semiconductor layer 14 due to the organic solvent is suppressed, which allows prevention of damage to the semiconductor layer 14. This lowers the cost of materials, and eliminates necessity to carry out the surface treatment for wettability control after formation of the protective film, as compared with the case where the fluorine-based materials are used.

In addition, in a process of forming (at the time of transferring) the protective film 16, a part of the semiconductor layer 14 is temporarily in a state of dissolving, in the neighborhood of the interface S between the protective film 16 (the protective-film ink layer 110a) and the semiconductor layer 14, as described above. The organic solvent is subsequently removed. Therefore, in the interface between the semiconductor layer 14 and the protective film 16, a contact area between these two layers increases (for example, the interface becomes uneven), which enhances adhesion of the protective film 16 to the semiconductor layer 14.

Moreover, in the backplane 1 of the present embodiment, the protective film 16 is formed to have a sufficient thickness, while covering not only the semiconductor layer 14 but also the source-drain electrodes 15a and 15b. Thus, the protective film 16 also serves as the interlayer insulating film. Further, the protective film 16 (the interlayer insulating film) and the through-via H1 for the interlayer wiring connection are collectively formed using the printing method described above. Therefore, processes following the formation of the protective film 16 are reduced.

In the present embodiment, as described above, the protective film 16 including the organic insulating material is provided on the semiconductor layer 14, and the material that is soluble in the organic solvent and causes phase separation with the organic semiconductor is used as the organic insulating material. This allows suppression of damage to the semiconductor layer 14 due to the organic solvent during the formation of the protective film 16, even when the organic insulating material is used for the protective film 16. Thus, as compared with the case where the protective film is formed using the fluororesin and the fluorine-based solvent, the cost of materials is low, and the surface treatment for wettability control after the formation of the protective film is unnecessary. Therefore, the protective film is produced at a low-cost and in a simple process.

Next, modifications (modifications 1 to 6) of the embodiment will be described. It is to be noted that in the following, the same elements as those of the embodiment will be provided with the same characters as those of the embodiment, and the description thereof will be omitted as appropriate.

Modification 1

In the embodiment, various printing methods such as the letterpress printing have been mentioned as the technique of forming the protective film 16. In the present modification, the reverse offset printing will be described as another example. When a printing plate for the reverse offset printing is produced, the protective-film ink layer 110a is formed by being applied over the entire surface on a flat blanket 111, for instance, as illustrated in FIG. 13A, for example. Next, an intaglio plate 112 having a depression section corresponding to a predetermined pattern (a pattern to be formed of the protective film 16) is prepared. The protective-film ink layer 110a on the blanket 111 is then pressed against an uneven surface of the intaglio plate 112, as illustrated in FIG. 13B. Subsequently, as illustrated in FIG. 13C, when the blanket 111 is removed from the intaglio plate 112, an unnecessary part of the protective-film ink layer 110a is removed by a protrusion surface of the intaglio plate 112. The protective-film ink layer 110a is thus formed on the blanket 111, to have a predetermined pattern. Using this as the printing plate, the protective-film ink layer 110a is transferred onto the semiconductor layer 14 (as well as the source-drain electrodes 15a and 15b). This allows the protective film 16 to be formed on the semiconductor layer 14, as in the embodiment.

Modification 2

Figure 14A:
FIGS. 14A to 14D are cross-sectional diagrams illustrating a procedure of forming a printing plate according to a modification 2.
Figure 14B:
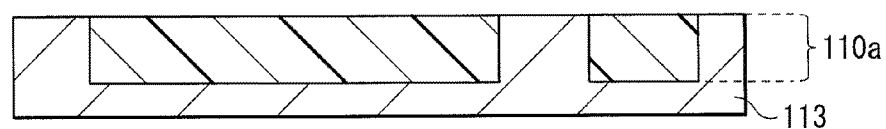
Figure 14C:
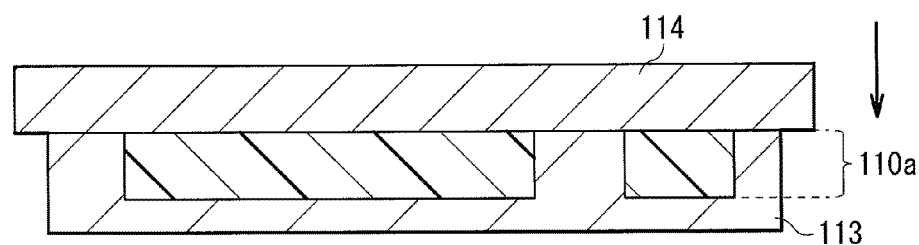
Figure 14D:
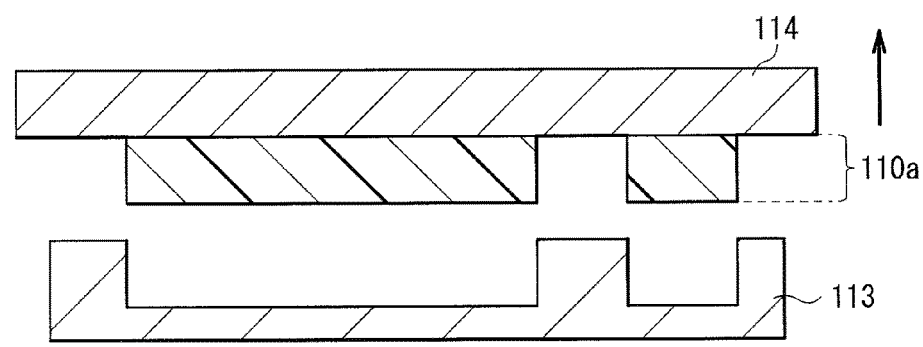

In this modification, the gravure offset printing will be described as another example of the method of printing the protective film 16. When a printing plate for the gravure offset printing is produced, for example, at first, an intaglio plate 113 having a depression section corresponding to a predetermined pattern (a pattern to be formed of the protective film 16) is prepared as illustrated in FIG. 14A. The depression section of the intaglio plate 113 is then filled with the protective-film ink layer 110a, as illustrated in FIG. 14B. Subsequently, a blanket 114 is pressed against the intaglio plate 113, as illustrated in FIG. 14C. Lastly, the blanket 114 is removed from the intaglio plate 113, and thereby the protective-film ink layer 110a is transferred to the blanket 114 as illustrated in FIG. 14D. In this way, the printing plate including the blanket 114 and the protective-film ink layer 110a is formed. Using this, the protective-film ink layer 110a is transferred onto the semiconductor layer 14 (as well as the source-drain electrodes 15a and 15b), and thereby the protective film 16 is formed on the semiconductor layer 14, as in the embodiment.

Modification 3

Figure 15:
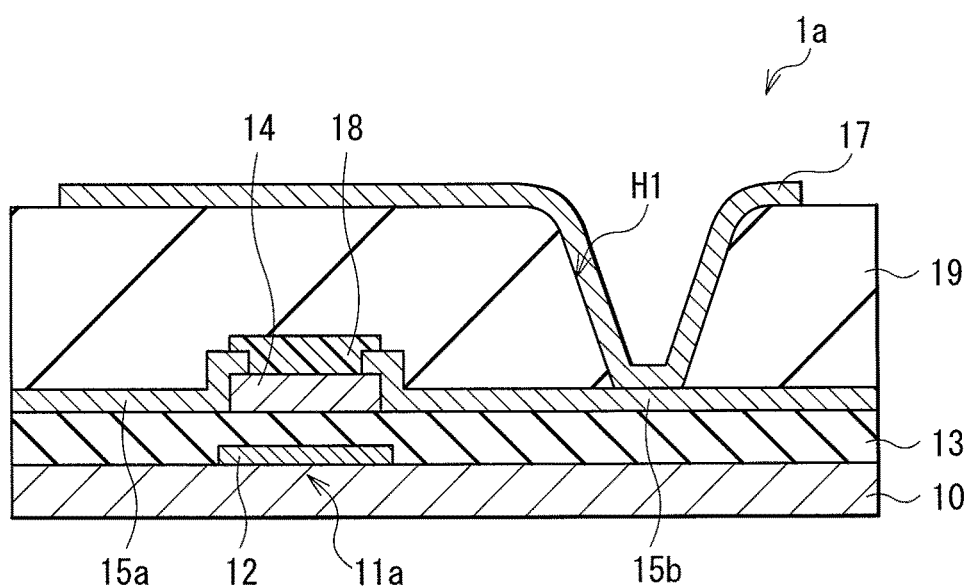
FIG. 15 is a cross-sectional diagram illustrating a schematic configuration of a backplane including a thin-film transistor (in the BGTC structure) according to a modification 3.

FIG. 15 is a cross-sectional diagram illustrating a schematic configuration of a semiconductor device (a TFT 11a, and a backplane 1a) according to the modification 3. The backplane 1a is, for example, a circuit board used for display driving, like the backplane 1 of the first embodiment. In addition, the TFT 11a is an organic TFT in the so-called BGTC structure, like the TFT 11 of the first embodiment. In the TFT 11a, the gate electrode 12 is provided on the substrate 10, and the semiconductor layer 14 is provided to face this gate electrode 12 with the gate insulator 13 interposed therebetween. On the semiconductor layer 14, the pair of the source-drain electrodes 15a and 15b are disposed, and a protective film 18 is formed.

In the present modification, however, the protective film 18 is formed to cover only a region right above the semiconductor layer 14 (i.e. a region between the source-drain electrodes 15a and 15b) selectively. Further, an interlayer insulating film 19 is provided on the protective film 18 as well as the source-drain electrodes 15a and 15b. The protective film 18 contains an organic insulating material similar to that of the protective film 16 of the above-described embodiment. However, the protective film 18 has a thickness of, for example, about 50 nm to about 1,000 nm. As a material of the interlayer insulating film 19, polyvinyl phenol may be used, for example. This interlayer insulating film 19 has the through-via H1 provided to secure, for example, electrical connection between the display electrode 17 and the source-drain electrode 15b.

The backplane 1a as described above may be produced as follows, for example. First, in a manner similar to the first embodiment, the gate electrode 12, the gate insulator 13, the semiconductor layer 14, and the source-drain electrodes 15a and 15b are formed on the substrate 10. The protective film 18 is then printed.

Figure 16A:
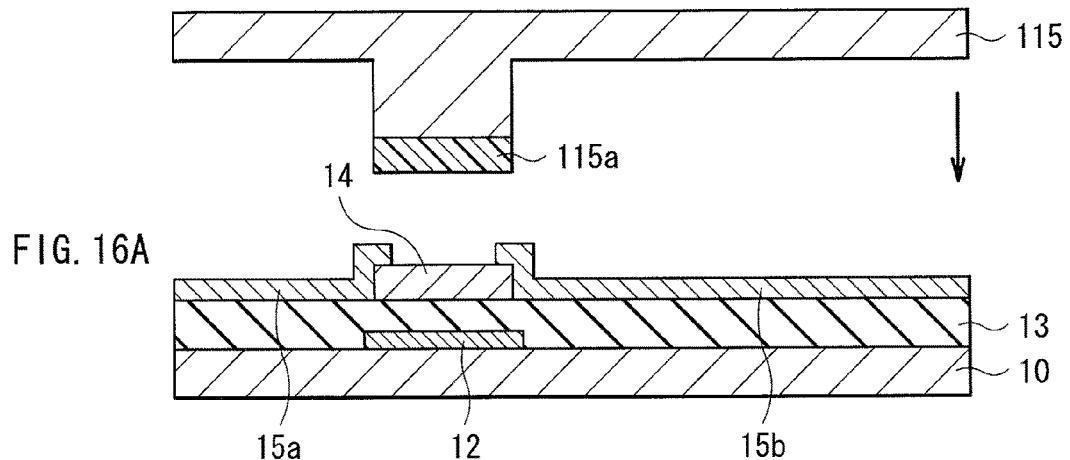
FIGS. 16A to 16C are cross-sectional diagrams used to describe a method of producing the backplane illustrated in FIG. 15.
Figure 16B:
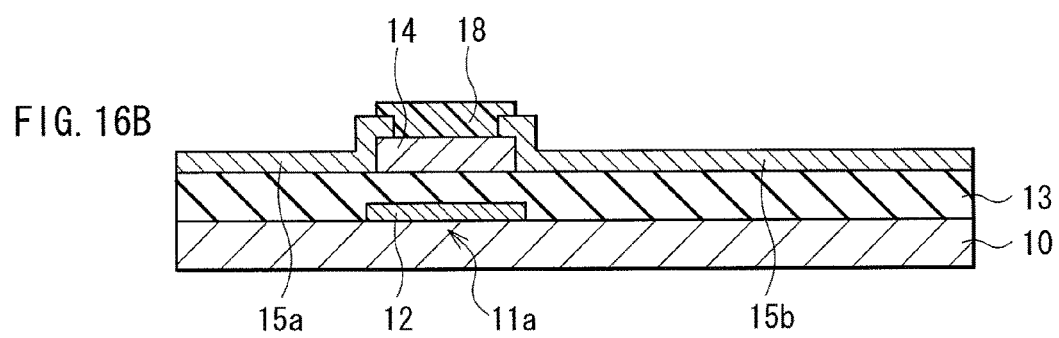

Specifically, at first, a protective-film ink layer 115a is transferred onto the semiconductor layer 14 by, for example, letterpress printing, as illustrated in FIG. 16A. A relief plate 115 has a projection only in a region facing the semiconductor layer 14 selectively, and the protective-film ink layer 115a is formed on this projection. The protective-film ink layer 115a contains an organic insulating material and an organic solvent similar to those of the protective-film ink layer 110a described in the first embodiment. In addition, it is desirable that the protective-film ink layer 115a be set to have viscosity that allows a layer state similar to that of the protective-film ink layer 110a to be maintained. As a result, the protective film 18 is formed only in a selective region on the semiconductor layer 14, as illustrated in FIG. 16B. The protective-film ink layer 115a contains the organic insulating material and the organic solvent similar to those of the protective-film ink layer 110a. Thus, in the present modification, progress of erosion of the semiconductor layer 14 due to the organic solvent in the protective-film ink layer 115a is suppressed, on a principle similar to that described in the first embodiment.

Figure 16C:
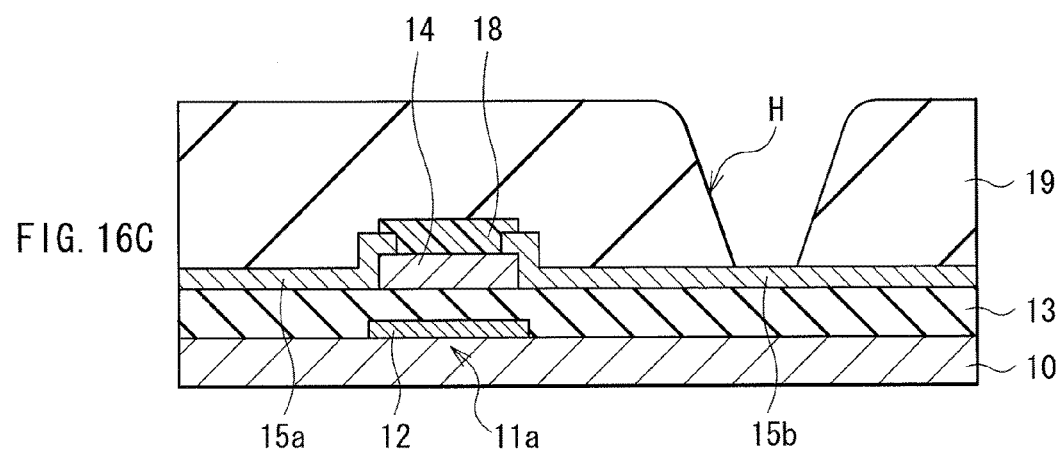

Next, as illustrated in FIG. 16C, the interlayer insulating film 19 is formed on the protective film 18 as well as the source-drain electrodes 15a and 15b, by using a coating or printing method, for example. At this moment, the through-via H1 is formed for interlayer wiring connection. Subsequently, reflow of the interlayer insulating film 19 is performed to thereby form a taper in a region corresponding to the through-via H1.

The protective film 18 may be formed only in the region right above the semiconductor layer 14, as described in the present modification. In this case, the protective film 18 is made of the organic insulating material that is soluble in the organic solvent and causes phase separation with the semiconductor layer 14, as in the first embodiment. Therefore, likewise, the protective film 18 is formed using an inexpensive organic insulating material, while suppressing damage to the semiconductor layer 14. Hence, effects similar to those of the first embodiment are obtained.

Modification 4

Figure 17:
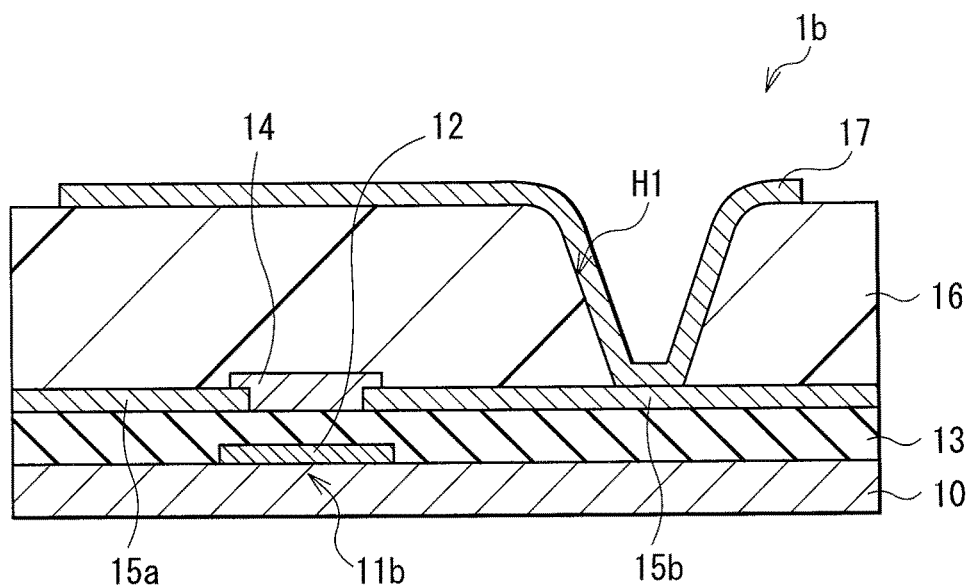
FIG. 17 is a cross-sectional diagram illustrating a schematic configuration of a backplane including a thin-film transistor (in a BGBC structure) according to a modification 4.

FIG. 17 is a cross-sectional diagram illustrating a schematic configuration of a semiconductor device (a TFT 11b, and a backplane 1b) according to the modification 4. The backplane 1b is, for example, a circuit board used for display driving, like the backplane 1 of the first embodiment. In addition, like the TFT 11 of the first embodiment, the TFT 11b is an organic TFT using an organic semiconductor in the semiconductor layer 14, and the protective film 16 also serving as the interlayer insulating film is provided on the semiconductor layer 14.

In the present modification, however, the TFT 11b has a BGBC structure having a bottom-gate (BG) structure and a bottom-contact (BC) structure. In other words, in the present modification, the source-drain electrodes 15a and 15b are electrically connected to the lower side of the semiconductor layer 14, which is different from the first embodiment. Specifically, in the TFT 11b, the gate electrode 12 is provided on the substrate 10, and the semiconductor layer 14 is provided to face this gate electrode 12, with the gate insulator 13 interposed therebetween. Between this semiconductor layer 14 and the gate insulator 13, the pair of the source-drain electrodes 15a and 15b are disposed in a state of being electrically separated from each other. The protective film 16 is provided to cover the source-drain electrodes 15a and 15b as well as the semiconductor layer 14, and has the through-via H1 in a region facing the source-drain electrode 15b. In this TFT 11b having the BGBC structure, the protective film 16 is allowed to be formed on the semiconductor layer 14, on a principle similar to that of the first embodiment.

Modification 5

Figure 18:
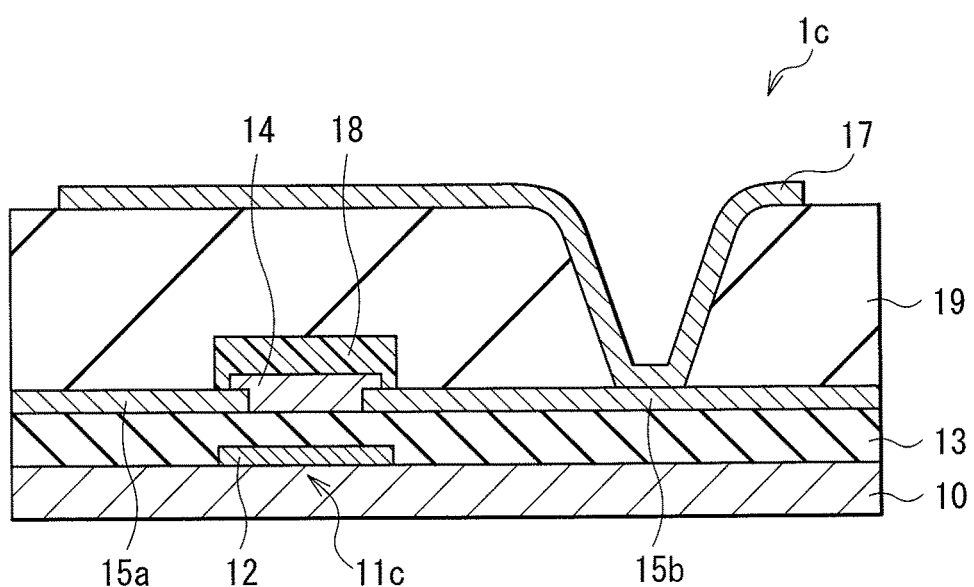
FIG. 18 is a cross-sectional diagram illustrating a schematic configuration of a backplane including a thin-film transistor (in the BGBC structure) according to a modification 5.

The configuration of the protective film 18 and the interlayer insulating film 19 of the modification 3 is also applicable to the TFT having the BGBC structure described in the modification 4. In other words, as illustrated in FIG. 18, a backplane (a backplane 1c) of the present modification has a TFT 11c of the BGBC structure. In addition thereto, the protective film 18 is provided only in a region right above the semiconductor layer 14, and the interlayer insulating film 19 is formed thereon. In this TFT 11c having the BGBC structure, the protective film 18 is formed on the semiconductor layer 14, on a principle similar to that of the first embodiment.

Modification 6

Figure 19:
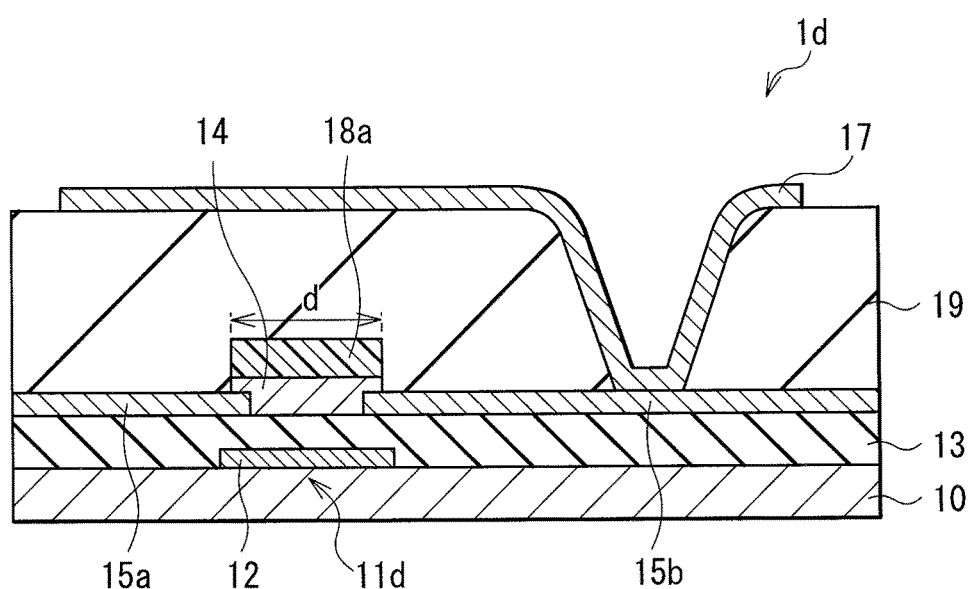
FIG. 19 is a cross-sectional diagram illustrating a schematic configuration of a backplane including a thin-film transistor (in the BGBC structure) according to a modification 6.

In the TFT having the bottom-contact (BC) structure described in each of the modifications 4 and 5, patterning of the semiconductor layer 14 may be performed using a protective film (a protective film 18a). FIG. 19 illustrates a schematic configuration of a semiconductor device (a TFT 11d, and a backplane 1d) according to the modification 6. As illustrated, in the TFT 11d having the BGBC structure in the present modification, the semiconductor layer 14 and the protective film 18a are formed to be in the same shape (the same pattern), in the structure in which the protective film 18a is selectively formed only right above the semiconductor layer 14. The protective film 18a is made of an organic insulating material similar to that of the protective film 16 in the first embodiment. The semiconductor layer 14 and the protective film 18a as described above may be produced as follows, for example.

Figure 20A:
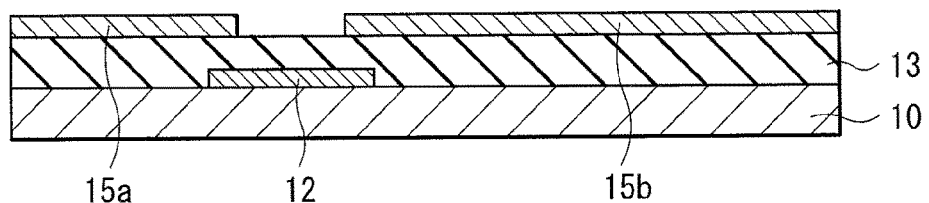
FIGS. 20A to 20D are cross-sectional diagrams used to describe a method of producing the backplane illustrated in FIG. 19.
Figure 20B:
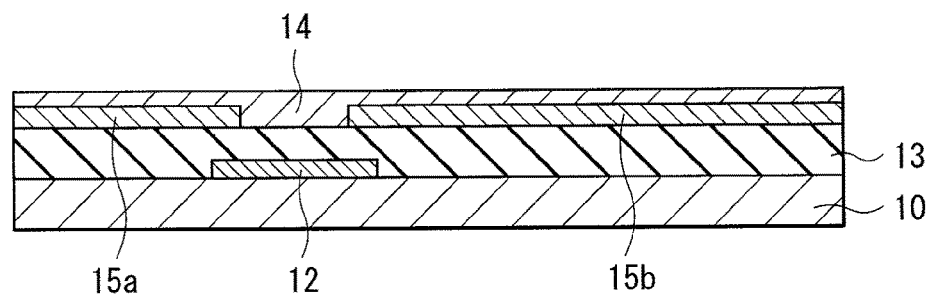
Figure 20C:
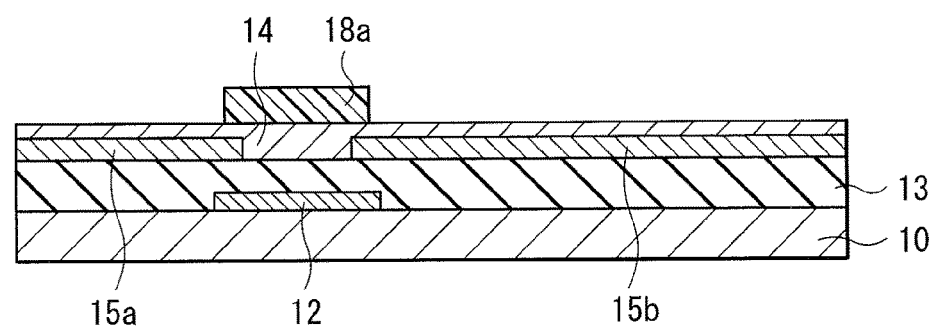

First, the gate electrode 12 and the gate insulator 13 are formed on the substrate 10, in a manner similar to the first embodiment. Subsequently, as illustrated in FIG. 20A, the source-drain electrodes 15a and 15b are formed on the gate insulator 13 by patterning, after being formed over the entire surface by sputtering, for example. Next, as illustrated in FIG. 20B, the semiconductor layer 14 is formed over the entire surface of the substrate 10 by, for instance, a coating or printing method. After that, as illustrated in FIG. 20C, the protective film 18a is formed in a selective region (a region facing the gate electrode 12) on the semiconductor layer 14, by using, for example, the printing method as described in the first embodiment and the like.

Figure 20D:
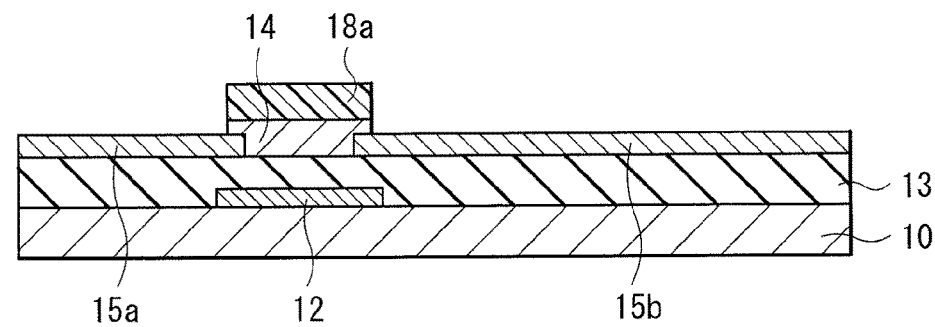

After the protective film 18a is thus formed, an unnecessary part of the semiconductor layer 14 is removed using this protective film 18a as a mask, as illustrated in FIG. 20D. At this moment, a solution, in which only the organic semiconductor of the semiconductor layer 14 is selectively dissolved, and the material of the protective film 18a (i.e. the material that causes phase separation with the organic semiconductor of the semiconductor layer 14) is not dissolved, is used as an etching solution. Acetone, butanol, and/or the like may be used as such a solution, when TIPS pentacene is used for the semiconductor layer 14 and PaMS is used for the protective film 18a, for example. In the TFT 11d having the BC structure, effects similar to those of the first embodiment are obtained, and also, the semiconductor layer 14 is allowed to be patterned using the protective film 18a, as described in the present modification.

Second Embodiment

Figure 21:
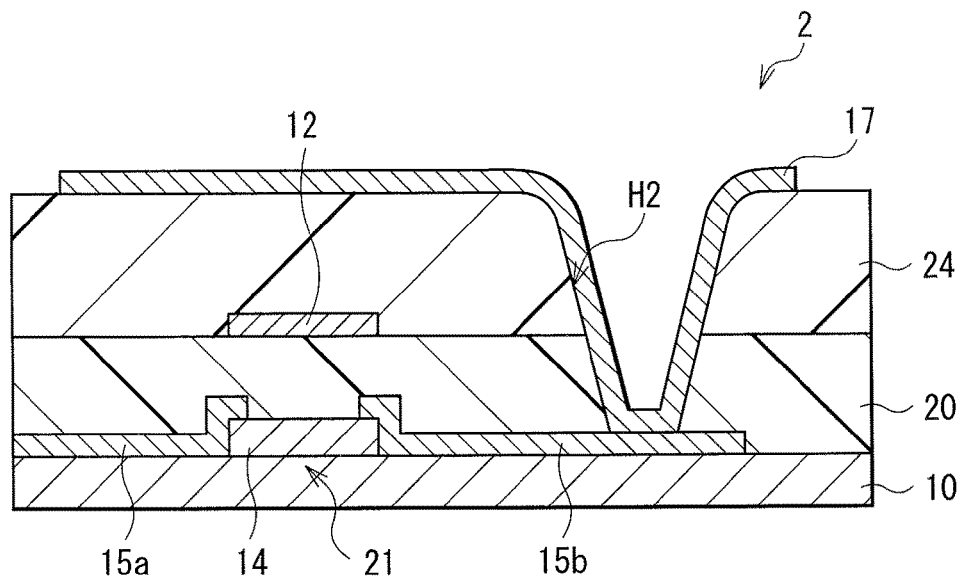
FIG. 21 is a cross-sectional diagram illustrating a schematic configuration of a backplane including a thin-film transistor (in a TGTC structure) according to a second embodiment of the disclosure.

FIG. 21 is a cross-sectional diagram illustrating a schematic configuration of a semiconductor device (a TFT 21, and a backplane 2) according to a second embodiment. The backplane 2 is, for example, a circuit board used for display driving, like the backplane 1 of the first embodiment, and includes the TFT 21. In the present embodiment, the TFT 21 has a top-gate (TG) structure unlike the first embodiment, and here, the TFT 21 has a so-called TGTC structure. In this TFT 21, a semiconductor layer 14 is formed in a selective region on a substrate 10, and on this semiconductor layer 14, a pair of source-drain electrodes 15a and 15b are disposed in a state of being electrically separated from each other. A protective film 20 is formed to cover the semiconductor layer 14 as well as the source-drain electrodes 15a and 15b, and a gate electrode 12 is disposed on this protective film 20. On the gate electrode 12, an interlayer insulating film 24 is formed. The protective film 20 and the interlayer insulating film 24 has a through-via (a through-hole) H2 facing the source-drain electrode 15b. A display electrode 17 provided on the interlayer insulating film 24 is electrically connected to the source-drain electrode 15b through this through-via H2.

The protective film 20 is made of an organic insulating material similar to that of the protective film 16 in the first embodiment. In the present embodiment, however, the protective film 20 serves as a gate insulator. In addition, the protective film 20 has a thickness of, for example, about 300 nm to about 1,000 nm.

In the present embodiment, the protective film 20 is made of the organic insulating material that is soluble in an organic solvent and causes phase separation with the semiconductor layer 14, as in the first embodiment. Thus, in the backplane 2 having the TFT 21 in the TGTC structure, the protective film 20 is formed using an inexpensive organic insulating material, while suppressing damage to the semiconductor layer 14. Therefore, effects similar to those of the first embodiment are obtained. In addition, since the protective film 20 also serves as the gate insulator, it is not necessary to form a gate insulator separately after formation of the protective film 20, thereby reducing processes subsequent to the formation of the protective film 20.

Modification 7

Figure 22:
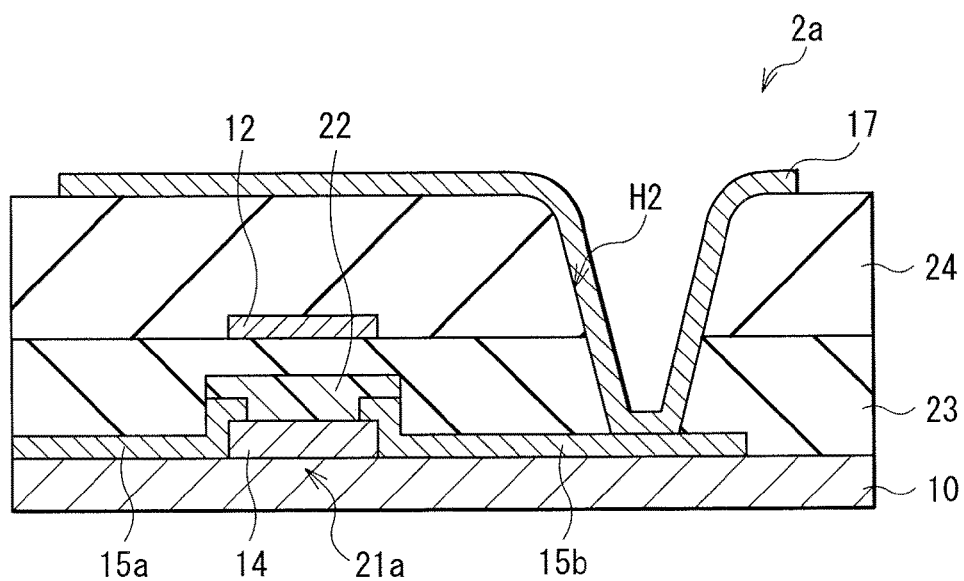
FIG. 22 is a cross-sectional diagram illustrating a schematic configuration of a backplane including a thin-film transistor (in the TGTC structure) according to a modification 7.

FIG. 22 is a cross-sectional diagram illustrating a schematic configuration of a semiconductor device (a TFT 21a, and a backplane 2a) according to a modification 7. The backplane 2a is, for example, a circuit board used for display driving, like the backplane 2 of the second embodiment. The backplane 2a includes the TFT 21a having the TGTC structure, like the TFT 21 of the second embodiment. In addition, in the TFT 21a, a protective film 22 is formed only in a region right above the semiconductor layer 14, as in the modification 3. In other words, in the TFT 21a, the semiconductor layer 14 is provided on the substrate 10, and the source-drain electrodes 15a and 15b are disposed on this semiconductor layer 14. The protective film 22 is formed to cover only the region (the region between the source-drain electrodes 15a and 15b) right above the semiconductor layer 14 selectively. Further, a gate insulator 23 is provided on the protective film 22 as well as the source-drain electrodes 15a and 15b. The gate electrode 12 is disposed on the gate insulator 23, and the interlayer insulating film 24 is formed thereon. The gate insulator 23 and the interlayer insulating film 24 has the through-via (the through-hole) H2. The protective film 22 contains an organic insulating material similar to that of the protective film 16 of the first embodiment. As a material of the gate insulator 23, a material similar to that of the gate insulator 13 described above may be used.

The protective film 22 may be formed only in the region right above the semiconductor layer 14, in the TFT 21a of the TGTC structure, as described in the present modification. In this case, the protective film 22 is made of the organic insulating material that is soluble in the organic solvent and causes phase separation with the semiconductor layer 14, as in the second embodiment. Thus, the protective film 22 is formed using an inexpensive organic insulating material, while suppressing damage to the semiconductor layer 14. Therefore, effects similar to those of the first embodiment are obtained.

Modification 8

Figure 23:
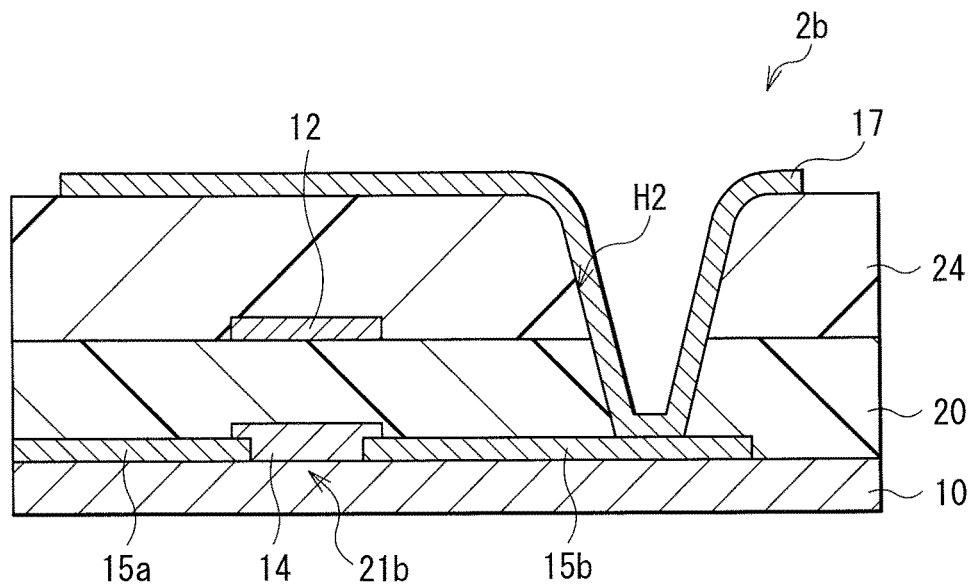
FIG. 23 is a cross-sectional diagram illustrating a schematic configuration of a backplane including a thin-film transistor (in a TGBC structure) according to a modification 8.

FIG. 23 is a cross-sectional diagram illustrating a schematic configuration of a semiconductor device (a TFT 21b, and a backplane 2b) according to a modification 8. The backplane 2b is, for example, a circuit board used for display driving, like the backplane 2 of the second embodiment. Like the TFT 21 of the second embodiment, the TFT 21b is an organic TFT using an organic semiconductor in the semiconductor layer 14, and the protective film 20 also serving as a gate insulator is provided on this semiconductor layer 14.

In the present modification, however, the TFT 21b is in a TGBC structure including the top-gate (TG) structure and the bottom-contact (BC) structure. In other words, in the present modification, the source-drain electrodes 15a and 15b are electrically connected to the lower side of the semiconductor layer 14, which is different from the second embodiment. Specifically, in the TFT 21b, the source-drain electrodes 15a and 15b in a state of being electrically separated from each other are provided between the substrate 10 and the protective film 20. The protective film 20 is provided to cover the source-drain electrodes 15a and 15b as well as the semiconductor layer 14. In the TFT 21b of the TGBC structure, the protective film 20 may be formed on the semiconductor layer 14, on a principle similar to that of the first embodiment.

Modification 9

Figure 24:
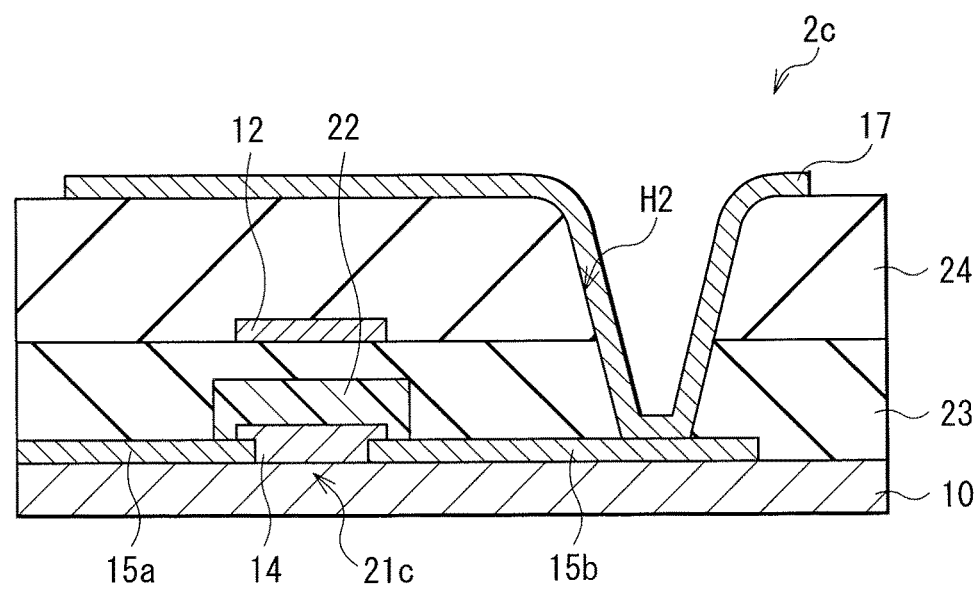
FIG. 24 is a cross-sectional diagram illustrating a schematic configuration of a backplane including a thin-film transistor (in the TGBC structure) according to a modification 9.

The configuration of the protective film 22 and the gate insulator 23 of the modification 7 is applicable to the TFT having the TGBC structure described in the modification 8. In other words, as illustrated in FIG. 24, in a backplane (a backplane 2c) of the present modification, a TFT 21c of the TGBC structure is provided, the protective film 22 is provided only in a region right above the semiconductor layer 14, and the gate insulator 23 is formed thereon. In the TFT 21c having the TGBC structure, the protective film 22 is formed on the semiconductor layer 14, on a principle similar to that of the first embodiment.

It is to be noted that, in the TFT of the TGBC structure, the semiconductor layer 14 may be patterned using the protective film as a mask, in a manner similar to that of the TFT 11d of the modification 6. In addition, the semiconductor layer 14 may be patterned using the protective film as a mask, not only in the BC structure, but in the TC structure (FIG. 1, and FIG. 22). However, in the TC structure, the semiconductor remains immediately below the source-drain electrodes 15a and 15b, without being removed.

APPLICATION EXAMPLES

Figure 25:
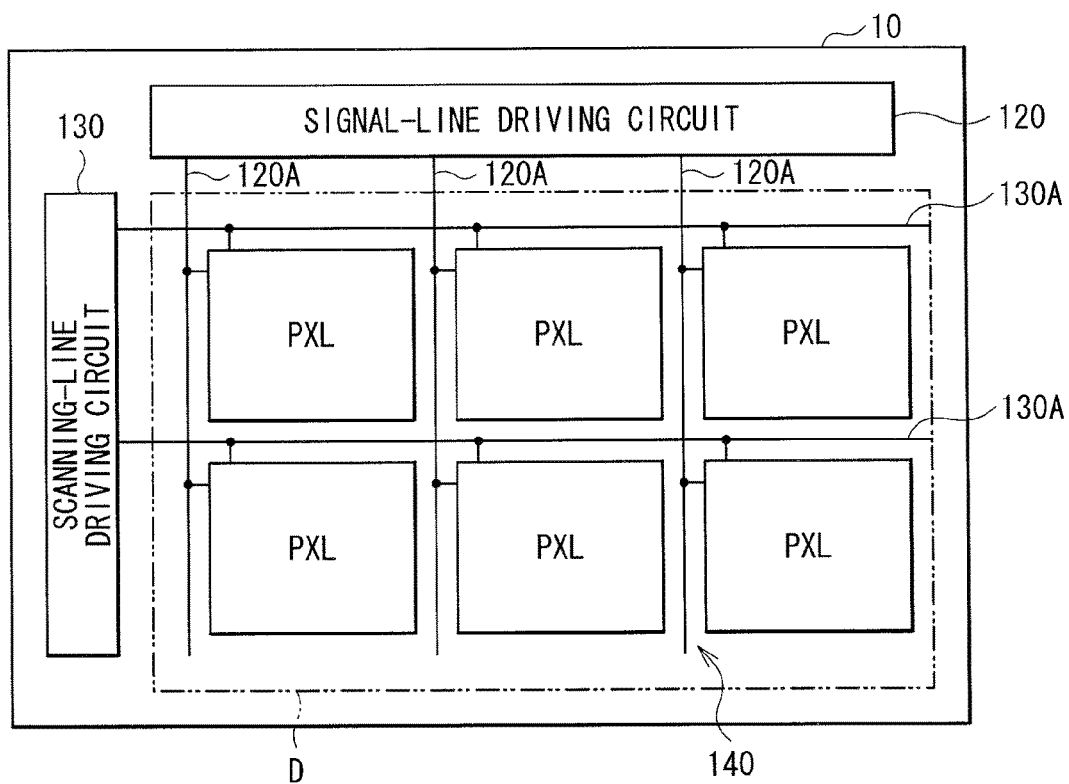

The backplane 1 (as well as the backplanes 1a to 1c and the backplanes 2, and 2a to 2c) described in the embodiment is suitable for use as a circuit board employed in a display driving circuit. It is to be noted that, for instance, a liquid crystal display, an organic EL display, an electronic paper display, or the like may be used as a display. FIG. 25 schematically illustrates an example of the display driving circuit.

This display driving circuit is provided on the substrate 10, and has a pixel driving circuit 140 in a display region D. Provided around the display region D are a signal-line driving circuit 120 and a scanning-line driving circuit 130 which are drivers for image display.

The pixel driving circuit 140 is driven by, for example, an active matrix system. In this pixel driving circuit 140, a plurality of signal lines 120A are arranged in a column direction, and a plurality of scanning lines 130A are arranged in a row direction. An intersection of each of the signal lines 120A and each of the scanning lines 130A corresponds to each pixel PXL. Each of the signal lines 120A is connected to the signal-line driving circuit 120, and an image signal is supplied from this signal-line driving circuit 120 to each of the pixels PXL through the signal line 120A. Each of the scanning lines 130A is connected to the scanning-line driving circuit 130, and a scanning signal is sequentially supplied from this scanning-line driving circuit 130 to each of the pixels PXL through the scanning line 130A.

The display driving circuit (display) described above may be mounted on an electronic unit according to any of the following application examples 1 to 6. Electronic units in all fields may be used as the electronic unit, including televisions, digital cameras, laptop personal computers, portable terminals such as portable telephones as well as smartphones, video camcorders, and/or the like. In other words, the backplane 1 is applicable to any kind of electronic unit that displays an externally input or internally generated image signal as a still or moving image.

Application Example 1

Figure 26:
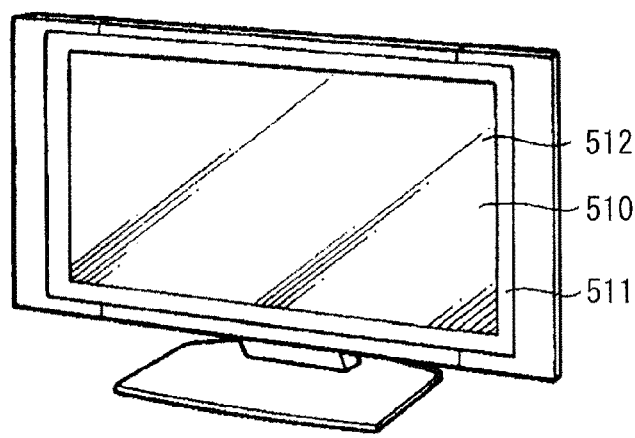

FIG. 26 illustrates an appearance of a television according to the application 1. This television has, for example, an image-display screen section 510 that includes a front panel 511 and a filter glass 512. The image-display screen section 510 corresponds to the display described above.

Application Example 2

Figure 27A:
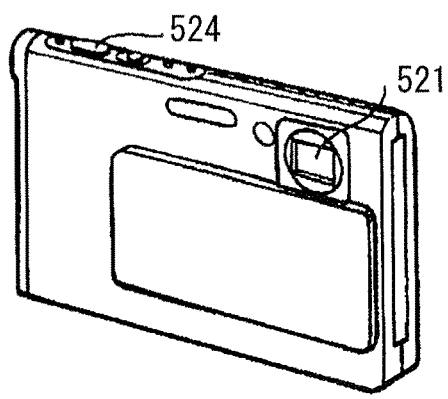
FIGS. 27A and 27B are perspective diagrams each illustrating an appearance of an application example 2, namely.
Figure 27B:
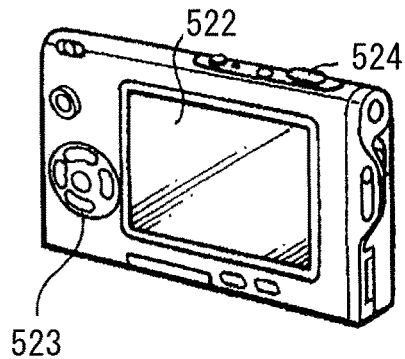

FIGS. 27A and 27B each illustrate an appearance of a digital camera according to the application 2. This digital camera includes, for example, a flash emitting section 521, a display section 522, a menu switch 523, and a shutter button 524. The display section 522 serves as the display described above.

Application Example 3

Figure 28:
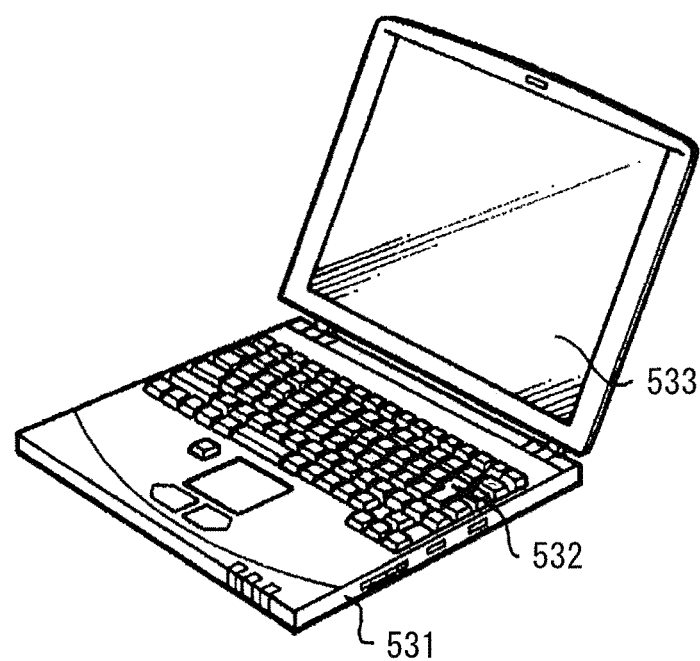
FIG. 28 is a perspective diagram illustrating an appearance of an application example 3.

FIG. 28 illustrates an appearance of a laptop personal computer according to the application 3. This laptop personal computer includes, for example, a main section 531, a keyboard 532 provided to enter characters and/or the like, and a display section 533. The display section 533 serves as the display described above.

Application Example 4

Figure 29:
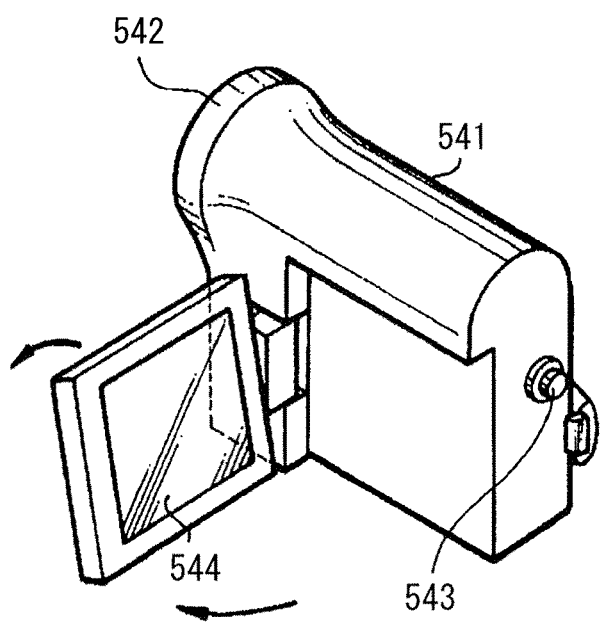
FIG. 29 is a perspective diagram illustrating an appearance of an application example 4.

FIG. 29 illustrates an appearance of a video camcorder according to the application 4. This video camcorder includes, for example, a main section 541, a lens 542 disposed on a front face of this main section 541 to shoot an image of a subject, a start and stop switch 543 used in shooting, and a display section 544 serving as the display described above.

Application Example 5

FIGS. 30A to 30G each illustrate an appearance of a portable telephone according to the application 5. This portable telephone is, for example, a unit in which an upper housing 710 and a lower housing 720 are connected by a coupling section (a hinge section) 730, and includes a display 740, a sub-display 750, a picture light 760, and a camera 770. The display 740 or the sub-display 750 corresponds to the display described above.

Application Example 6

Figure 31A:
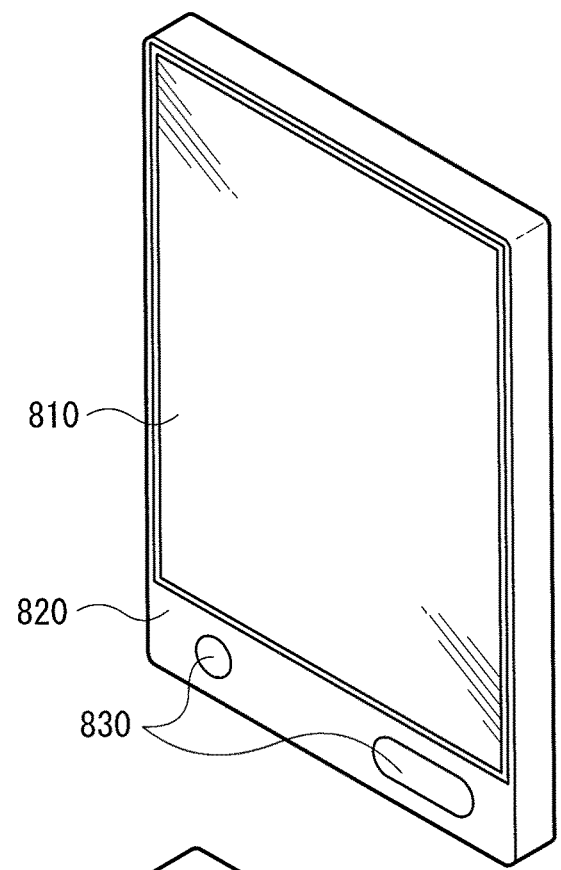
FIGS. 31A and 31B are perspective diagrams each illustrating an appearance of an application example 6.
Figure 31B:
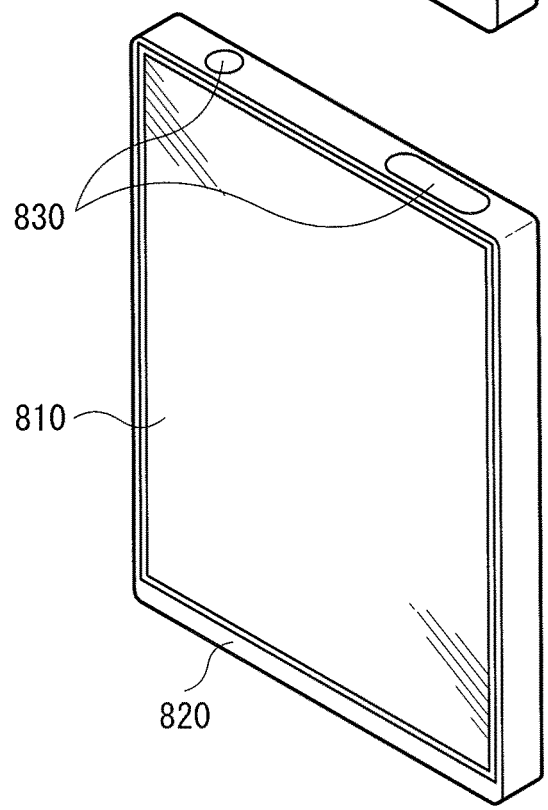

FIGS. 31A and 31B each illustrate an appearance of a smartphone according to the application example 6. This smartphone includes, for example, a display section 810, a non-display section 820, and an operation section 830. The operation section 830 may be formed on the same surface as a surface (a front surface) of the display section 810 as illustrated in FIG. 31A, or may be formed on a surface (a top surface) different from the surface of the display section 810 as illustrated in FIG. 31B.

The embodiments, the modifications, and the application examples have been described above, but the contents of the disclosure may be variously modified without being limited to these embodiments and the like. For example, other layer or film not illustrated may be provided in addition to each layer described in the embodiments and the like. In addition, application examples of the semiconductor device according to the embodiments and the like of the disclosure are not limited to the displays described above. The semiconductor device according to the disclosure may be applicable to a sensor with a photoelectric transducer, an RFID (Radio Frequency IDentification) tag, an IC (Integrated Circuit), a memory, and/or the like.

It is possible to achieve at least the following illustrative configurations from the above-described example embodiments and the modifications of the disclosure.

In some embodiments, there is provided a method of forming a thin-film transistor (TFT). The method comprises forming a body region of the TFT, the body region comprising an organic semiconducting material, and forming a protective layer comprising an organic insulating material. Forming the protective layer comprises contacting the body region of the TFT with a solution comprising the organic insulating material. The organic insulating material is a material that phase separates with the organic semiconducting material when the solution contacts the organic semiconducting material.

Additionally or alternatively, in some such embodiments, in the method, contacting the body region of the TFT with the solution comprises contacting the body region of the TFT with a solution comprising the organic insulating material dissolved in an organic solvent.

Additionally or alternatively, in some such embodiments, in the method, contacting the body region with the solution comprises contacting the body region with a liquid solution comprising the organic insulating material dissolved in the organic solvent.

Additionally or alternatively, in some such embodiments, the method further comprises forming a source and/or drain for the TFT contacting the body region of the TFT. Additionally, forming the protective layer comprises forming the protective layer contacting the source and/or the drain.

Additionally or alternatively, in some such embodiments, in the method, forming the body region comprises forming the body region such that the body region, when viewed from a first side of the TFT, has a first surface area, and forming the protective layer comprises forming the protective layer such that the protective layer, when viewed from the first side of the TFT, is disposed on the body region and has the first surface area.

Additionally or alternatively, in some such embodiments, the method further comprises, forming a conduction terminal for the TFT contacting the body region of the TFT, the conduction terminal being a source or a drain of the TFT, and forming an insulating layer contacting the protective layer and the conduction terminal.

Additionally or alternatively, in some such embodiments, the method further comprises, forming a second TFT on a same substrate as the TFT. Forming the second TFT comprises forming a second body region of the second TFT, the second body region comprising the organic semiconducting material, forming a second protective layer comprising the organic insulating material, and forming a second conduction terminal of the second TFT. In the method, forming the insulating layer comprises forming an insulating layer contacting the protective layer and the conduction terminal of the TFT and contacting the second protective layer and second conduction terminal of the second TFT.

Additionally or alternatively, in some such embodiments, in the method, forming the protective layer further comprises removing the organic solvent following contacting the body region with the solution.

Additionally or alternatively, in some such embodiments, in the method, forming the protective layer further comprises forming a first layer comprising the solution. The first layer comprises a first portion having a first concentration of the organic insulating material and a second portion having a second concentration of the organic insulating material. The second concentration is lower than the first concentration. Additionally, in the method, contacting the body region of the TFT with the solution comprises contacting the body region with the second portion of the first layer.

Additionally or alternatively, in some such embodiments, in the method, forming the first layer comprising the solution comprises forming a liquid comprising the solution and increasing a viscosity of the liquid.

Additionally or alternatively, in some such embodiments, in the method, forming the body region comprises forming the body region according to a pattern, and forming the protective layer comprises forming a first layer according to the pattern, the first layer comprising the solution and contacting the body region with the first layer.

Additionally or alternatively, in some such embodiments, the method further comprises forming a conduction terminal of the TFT, the conduction terminal being a source or a drain of the TFT and forming an electrode contacting the conduction terminal of the TFT.

Additionally or alternatively, in some such embodiments, in the method, forming the pixel electrode comprises removing a portion of the protective layer to produce an opening in the protective layer and forming at least a part of the electrode in the opening.

Additionally or alternatively, in some such embodiments, the method further comprises forming a gate for the TFT separated from the body region of the TFT by a gate insulator.

Additionally or alternatively, in some such embodiments, in the method forming the TFT comprises forming the TFT on a substrate, and forming the gate separated from the body region by the gate insulator comprises forming the gate at a position between the substrate and the body region of the TFT.

Additionally or alternatively, in some such embodiments, the body region has a first side facing the gate and a second side opposite the first side, and the method further comprises forming a conduction terminal of the TFT contacting the body region, the conduction terminal being a source or a drain of the TFT and contacting the body region on the first side of the body region.

Additionally or alternatively, in some such embodiments, the method further comprises, forming, in contact with the protective layer, a gate for the TFT, the gate being separated from the body region of the TFT by the protective layer.

Additionally or alternatively, in some such embodiments, in the method, forming the TFT comprises forming the TFT on a substrate, the body region has a first side facing the substrate and a second side opposite the first side, and forming the gate separated from the body region by the protective layer comprises forming the gate on the second side of the body region.

Additionally or alternatively, in some such embodiments, the method further comprises forming a conduction terminal of the TFT contacting the body region, the conduction terminal being a source or a drain of the TFT and contacting the body region on the first side of the body region.

In other embodiments, there is provided an apparatus comprising a thin-film transistor (TFT). The TFT comprises a body region comprising an organic semiconducting material and a protective layer comprising an organic insulating material and contacting the body region. The organic insulating material is a material that, when a solution comprising the organic insulating material contacts the organic semiconducting material, causes the organic insulating material to phase separate with the organic semiconducting material.

Additionally or alternatively, in some such other embodiments, in the apparatus, the organic semiconducting material has a first molecular weight and the organic insulating material has a second molecular weight, and the first molecular weight and second molecular weight have values such that the organic semiconductor material and organic insulating material phase separate when in contact.

Additionally or alternatively, in some such other embodiments, in the apparatus, the organic semiconducting material has a first molecular weight and the organic insulating material has a second molecular weight, and the second molecular weight is more than ten times greater than the first molecular weight.

Additionally or alternatively, in some such other embodiments, in the apparatus, the second molecular weight is more than one hundred times greater than the first molecular weight.

Additionally or alternatively, in some such other embodiments, in the apparatus, the organic semiconducting material has a first molecular weight and the organic insulating material has a second molecular weight, and the first molecular weight and second molecular weight have values such that when the solution comprising the organic insulating material contacts the organic semiconducting material, the organic insulating material phase separates with the organic semiconducting material.

Additionally or alternatively, in some such other embodiments, in the apparatus, the organic semiconducting material has a first molecular weight and the organic insulating material has a second molecular weight, and the first molecular weight and second molecular weight have values such that when the solution comprising the organic insulating material contacts the organic semiconducting material, at least partially dissolves the organic semiconducting material, and mixes with the organic semiconducting material, the organic semiconducting material phase separates from the organic insulating material.

Additionally or alternatively, in some such other embodiments, in the apparatus, the TFT further comprises a region forming an interface between the body region and the protective layer, the region comprising a mixture of the organic semiconducting material and the organic insulating material.

Additionally or alternatively, in some such other embodiments, in the apparatus, the organic insulating material does not include an OH group.

Additionally or alternatively, in some such other embodiments, in the apparatus, the TFT further comprises a gate insulator and a gate separated from the body region by the gate insulator.

Additionally or alternatively, in some such other embodiments, the apparatus further comprises a substrate and the gate is positioned between the substrate and the body region.

Additionally or alternatively, in some such other embodiments, in the apparatus, the body region has a first side facing the substrate and a second side opposite the first side, and the TFT further comprises a conduction terminal. The conduction terminal is a source or a drain of the TFT, and the conduction terminal contacts the body region on the second side of the body region.

Additionally or alternatively, in some such other embodiments, the apparatus further comprises a substrate, and the TFT further comprises a gate contacting the protective layer and separated from the body region by the protective layer. The body region is positioned in the TFT between the substrate and the gate.

Additionally or alternatively, in some such other embodiments, in the apparatus, the body region has a first side facing the substrate and a second side opposite the first side, and the TFT further comprises a conduction terminal. The conduction terminal is a source or a drain of the TFT, and the conduction terminal contacts the body region on the first side of the body region.

Additionally or alternatively, in some such other embodiments, in the apparatus, the TFT further comprises a conduction terminal contacting the body region and contacting the protective layer. The conduction terminal is a source or a drain of the TFT.

Additionally or alternatively, in some such other embodiments, in the apparatus, the TFT further comprises a pixel electrode, wherein a first portion of the pixel electrode contacts the conduction terminal and a second portion of the pixel is separated from the conduction terminal by the protective layer.

Additionally or alternatively, in some such other embodiments, in the apparatus, the second portion of the pixel electrode is further separated from the conduction terminal by an insulating layer.

In some further embodiments, there is provided an apparatus comprising a display screen. The display screen comprises a plurality of thin-film transistors (TFTs). Each TFT of the plurality of TFTs comprises a body region comprising an organic semiconducting material and a protective layer comprising an organic insulating material and contacting the body region. The organic insulating material is a material that, when a solution comprising the organic insulating material contacts the organic semiconducting material, causes the organic insulating material to phase separate with the organic semiconducting material.

In one embodiment, there is provided a method of forming a thin-film transistor (TFT) comprising forming a body region of the TFT, the body region comprising an organic semiconducting material, and forming a protective layer comprising an organic insulating material. Forming the protective layer comprises contacting the body region of the TFT with a solution. The organic insulating material is a material that phase separates with the organic semiconducting material when the solution contacts the organic semiconducting material.

In another embodiment, there is provided an apparatus comprising a thin-film transistor (TFT). The TFT comprises a body region comprising an organic semiconducting material and a protective layer comprising an organic insulating material and contacting the body region. The organic semiconducting material is a material that, when a solution comprising the organic insulating material contacts the organic semiconducting material, causes the organic insulating material to phase separate with the organic semiconducting material.

In a further embodiment, there is provided an apparatus comprising a display screen, where the display screen comprises a plurality of thin-film transistors (TFTs). Each TFT of the plurality of TFTs comprises a body region comprising an organic semiconducting material and a protective layer comprising an organic insulating material and contacting the body region. The organic semiconducting material is a material that, when a solution comprising the organic insulating material contacts the organic semiconducting material, causes the organic insulating material to phase separate with the organic semiconducting material.

What is claimed is:

1. An apparatus comprising:
   a thin-film transistor (TFT) comprising:
   a body region comprising an organic semiconducting material; and
   a protective layer comprising an organic insulating material and contacting the body region,
   wherein the organic insulating material is a material that, when a solution comprising the organic insulating material contacts the organic semiconducting material, causes the organic insulating material to phase separate with the organic semiconducting material.

2. The apparatus of claim 1, wherein the organic semiconducting material has a first molecular weight and the organic insulating material has a second molecular weight, the first molecular weight and second molecular weight having values such that the organic semiconductor material and organic insulating material phase separate when in contact.

3. The apparatus of claim 1, wherein:
   the body region has a first side facing the substrate and a second side opposite the first side;
   the apparatus further comprises a substrate; and
   the TFT further comprises:
   a gate insulator;
   a gate separated from the body region by the gate insulator and positioned between the substrate and the body region; and
   a conduction terminal, the conduction terminal being a source or a drain of the TFT, the conduction terminal contacting the body region on the second side of the body region.

4. The apparatus of claim 1, wherein:
   the body region has a first side facing the substrate and a second side opposite the first side;
   the apparatus further comprises a substrate; and
   the TFT further comprises:
   a gate contacting the protective layer and separated from the body region by the protective layer, the body region being positioned in the TFT between the substrate and the gate; and
   a conduction terminal, the conduction terminal being a source or a drain of the TFT, the conduction terminal contacting the body region on the first side of the body region.

5. The apparatus of claim 1, wherein the TFT further comprises:
   a conduction terminal contacting the body region and contacting the protective layer, the conduction terminal being a source or a drain of the TFT; and
   a pixel electrode, wherein a first portion of the pixel electrode contacts the conduction terminal and a second portion of the pixel is separated from the conduction terminal by the protective layer,
   wherein the second portion of the pixel electrode is further separated from the conduction terminal by an insulating layer.

6. An apparatus comprising:
   a thin-film transistor (TFT) comprising:
   a body region comprising an organic semiconducting material; and
   a protective layer comprising an organic insulating material and contacting the body region,
   wherein the organic insulating material is a material that, when a solution comprising the organic insulating material contacts the organic semiconducting material, causes the organic insulating material to phase separate with the organic semiconducting material, and
   wherein the organic semiconducting material has a first molecular weight and the organic insulating material has a second molecular weight, the second molecular weight being more than one hundred times greater than the first molecular weight.

7. The apparatus of claim 6, further comprising:
   a display screen, the display screen comprising a plurality of the TFT.

8. An apparatus comprising:
   a thin-film transistor (TFT) comprising:
   a body region comprising an organic semiconducting material; and
   a protective layer comprising an organic insulating material and contacting the body region,
   wherein the organic insulating material is a material that, when a solution comprising the organic insulating material contacts the organic semiconducting material, causes the organic insulating material to phase separate with the organic semiconducting material, and
   wherein the organic semiconducting material has a first molecular weight and the organic insulating material has a second molecular weight, the first molecular weight and second molecular weight having values such that when the solution comprising the organic insulating material contacts the organic semiconducting material, at least partially dissolves the organic semiconducting material, and mixes with the organic semiconducting material, the organic semiconducting material phase separates from the organic insulating material.

9. The apparatus of claim 8, further comprising:
   a display screen, the display screen comprising a plurality of the TFT.

10. An apparatus comprising:
    a thin-film transistor (TFT) comprising:
    a body region comprising an organic semiconducting material; and
    a protective layer comprising an organic insulating material and contacting the body region,
    wherein the organic insulating material is a material that, when a solution comprising the organic insulating material contacts the organic semiconducting material, causes the organic insulating material to phase separate with the organic semiconducting material, and wherein the TFT further comprises a region forming an interface between the body region and the protective layer, the region comprising a mixture of the organic semiconducting material and the organic insulating material.

11. An apparatus comprising:
a thin-film transistor (TFT) comprising:
   a body region comprising an organic semiconducting material; and
   a protective layer comprising an organic insulating material and contacting the body region,
wherein the organic insulating material is a material that, when a solution comprising the organic insulating material contacts the organic semiconducting material, causes the organic insulating material to phase separate with the organic semiconducting material, and
wherein the organic insulating material does not include an OH group.

12. The apparatus of claim 11, further comprising:
a display screen, the display screen comprising a plurality of the TFT.

13. An apparatus comprising:
a display screen, the display screen comprising:
   a plurality of thin-film transistors (TFTs), wherein each TFT of the plurality of TFTs comprises:
      a body region comprising an organic semiconducting material; and
      a protective layer comprising an organic insulating material and contacting the body region,
   wherein the organic insulating material is a material that, when a solution comprising the organic insulating material contacts the organic semiconducting material, causes the organic insulating material to phase separate with the organic semiconducting material,
   wherein at least two TFTs of the plurality further comprise a region forming an interface between the body region and the protective layer, the region comprising a mixture of the organic semiconducting material and the organic insulating material.

* * * * *